(12) United States Patent
Kaya et al.

(10) Patent No.: US 10,038,059 B2
(45) Date of Patent: Jul. 31, 2018

(54) SEMICONDUCTOR DEVICE

(71) Applicant: Renesas Electronics Corporation, Koutou-ku, Tokyo (JP)

(72) Inventors: Yoshinori Kaya, Ibaraki (JP); Yasushi Nakahara, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/203,981

(22) Filed: Jul. 7, 2016

(65) Prior Publication Data
US 2017/0062567 A1 Mar. 2, 2017

(30) Foreign Application Priority Data

Aug. 28, 2015 (JP) ................. 2015-169751

(51) Int. Cl.
| | | |
|---|---|---|
| H01L 29/10 | (2006.01) | |
| H01L 29/78 | (2006.01) | |
| H01L 29/06 | (2006.01) | |
| H01L 29/40 | (2006.01) | |
| H03K 3/356 | (2006.01) | |
| H03K 17/06 | (2006.01) | |

(52) U.S. Cl.
CPC ........ *H01L 29/1087* (2013.01); *H01L 29/063* (2013.01); *H01L 29/0623* (2013.01); *H01L 29/1083* (2013.01); *H01L 29/1095* (2013.01); *H01L 29/402* (2013.01); *H01L 29/7823* (2013.01); *H03K 3/356* (2013.01); *H03K 17/06* (2013.01); *H03K 2217/0063* (2013.01); *H03K 2217/0072* (2013.01); *H03K 2217/0081* (2013.01)

(58) Field of Classification Search
CPC ............. H01L 29/1087; H01L 29/7823; H01L 29/0623; H01L 29/063; H01L 29/1095; H01L 29/1083; H01L 29/402; H01L 29/0696; H03K 3/356
See application file for complete search history.

(56) References Cited

U.S. PATENT DOCUMENTS

| | | | |
|---|---|---|---|
| 5,894,156 A | 4/1999 | Terashima et al. | |
| 7,538,407 B2 | 5/2009 | Taki et al. | |
| 2013/0341718 A1* | 12/2013 | Kim ...................... | H01L 29/402 257/342 |

FOREIGN PATENT DOCUMENTS

| | | |
|---|---|---|
| JP | H9-283716 A | 10/1997 |
| JP | 2005-123512 A | 5/2005 |

* cited by examiner

*Primary Examiner* — Cuong B Nguyen
(74) *Attorney, Agent, or Firm* — Shapiro, Gabor and Rosenberger, PLLC

(57) ABSTRACT

An improvement is achieved in the performance of a semiconductor device. The semiconductor device includes a coupling transistor made of a p-channel MOSFET and formed in an n⁻-type semiconductor region over a base made of a p-type semiconductor. The coupling transistor has a resurf layer as a p-type semiconductor region and couples a lower-voltage circuit region to a higher-voltage circuit region to which a power supply potential higher than the power supply potential supplied to the lower-voltage circuit region is supplied. The semiconductor device has a p-type semiconductor region formed in the portion of the n⁻-type semiconductor region which surrounds the coupling transistor in plan view.

18 Claims, 25 Drawing Sheets

SEMICONDUCTOR DEVICE

CROSS-REFERENCE TO RELATED APPLICATIONS

The disclosure of Japanese Patent Application No. 2015-169751 filed on Aug. 28, 2015 including the specification, drawings and abstract is incorporated herein by reference in its entirety.

BACKGROUND

The present invention relates to a semiconductor device, which can be used appropriately as, e.g., a semiconductor device including two circuits to which different power supply potentials are supplied.

In a semiconductor device provided with a control circuit which generates a control signal for a power semiconductor element, between the control circuit (first control circuit) and the power semiconductor element, another control circuit (second control circuit) is provided to input the control signal to the power semiconductor element. A power supply potential to the second control circuit is generally equal to or lower than a power supply potential to the power semiconductor element and higher than a power supply potential to the first control circuit. The control circuit supplied with the lower power supply potential and the control circuit supplied with the higher power supply potential are electrically isolated from each other by an isolation region using a pn junction.

Between the control circuit supplied with the lower power supply potential and the control circuit supplied with the higher power supply potential, a level shift circuit for shifting a voltage level is provided to transmit the control signal. The level shift circuit has a level shifter made of a MOSFET (Metal Oxide Semiconductor Field Effect Transistor) as a coupling transistor which couples the control circuit supplied with the lower power supply potential to the control circuit supplied with the higher power supply potential.

Specifically, to transmit the signal from the control circuit supplied with the lower power supply potential to the control circuit supplied with the higher power supply potential, the level shift circuit has a level-up shifter made of an re-channel MOSFET as a coupling transistor. Conversely, to transmit the signal from the control circuit supplied with the higher power supply potential to the control circuit supplied with the lower power supply potential, the level shift circuit has a level-down shifter made of a p-channel MOSFET as a coupling transistor.

Japanese Unexamined Patent Publication No. Hei 9(1997)-283716 (Patent Document 1) discloses a technique in which, in a semiconductor device, a slit-like region having a first conductivity type is interposed between a second region having a second conductivity type and a third region having the second conductivity type and a pn junction formed of the second or third region and the slit-like region is depleted.

Japanese Unexamined Patent Publication No. 2005-123512 (Patent Document 2) discloses a technique in which an NMOS is used for a level shift from a lower-potential reference circuit region to a higher-potential reference circuit region and a PMOS is used for a level shift from the higher-potential reference circuit region to the lower-potential reference circuit region

RELATED ART DOCUMENTS

Patent Documents

[Patent Document 1]
  Japanese Unexamined Patent Publication No. Hei 9(1997)-283716
[Patent Document 2]
  Japanese Unexamined Patent Publication No. 2005-123512

SUMMARY

In such a semiconductor device, a coupling transistor made of a p-channel MOSFET and a semiconductor element made of, e.g., an n-channel complete-depletion-type MOSFET or diode may be mounted in proximate and mixed relation. In such a case, a parasitic bipolar transistor or a parasitic diode formed between the semiconductor element and the coupling transistor made of a p-channel MOSFET that have been mounted in mixed relation may be operated. As a result, a leakage current may flow through the parasitic bipolar transistor or parasitic diode to degrade the performance of the semiconductor device.

Other problems and novel features of the present invention will become apparent from a statement in the present specification and the accompanying drawings.

According to an embodiment, a semiconductor device includes a coupling transistor made of a p-channel MOSFET and formed in an n-type semiconductor layer over a base made of a p-type semiconductor. The coupling transistor has a resurf layer as a p-type semiconductor region and couples a lower-voltage circuit region to a higher-voltage circuit region to which a power supply potential higher than the power supply potential supplied to the lower-voltage circuit region is supplied. The semiconductor device also has a p-type semiconductor region formed in the portion of the n-type semiconductor layer which surrounds the coupling transistor in plan view.

According to another embodiment, a semiconductor device includes a coupling transistor made of a p-channel MOSFET and formed in an n-type semiconductor layer over a base made of a p-type semiconductor. The coupling transistor has a resurf layer as a p-type semiconductor region and couples a lower-voltage circuit region to a higher-voltage circuit region to which a power supply potential higher than the power supply potential supplied to the lower-voltage circuit region is supplied. The semiconductor device also has a trench portion formed in the portion of the n-type semiconductor layer which surrounds the coupling transistor in plan view and an insulating film embedded in the trench portion.

According to each of the embodiments, the performance of the semiconductor device can be improved.

DETAILED DESCRIPTION

Figure 1:
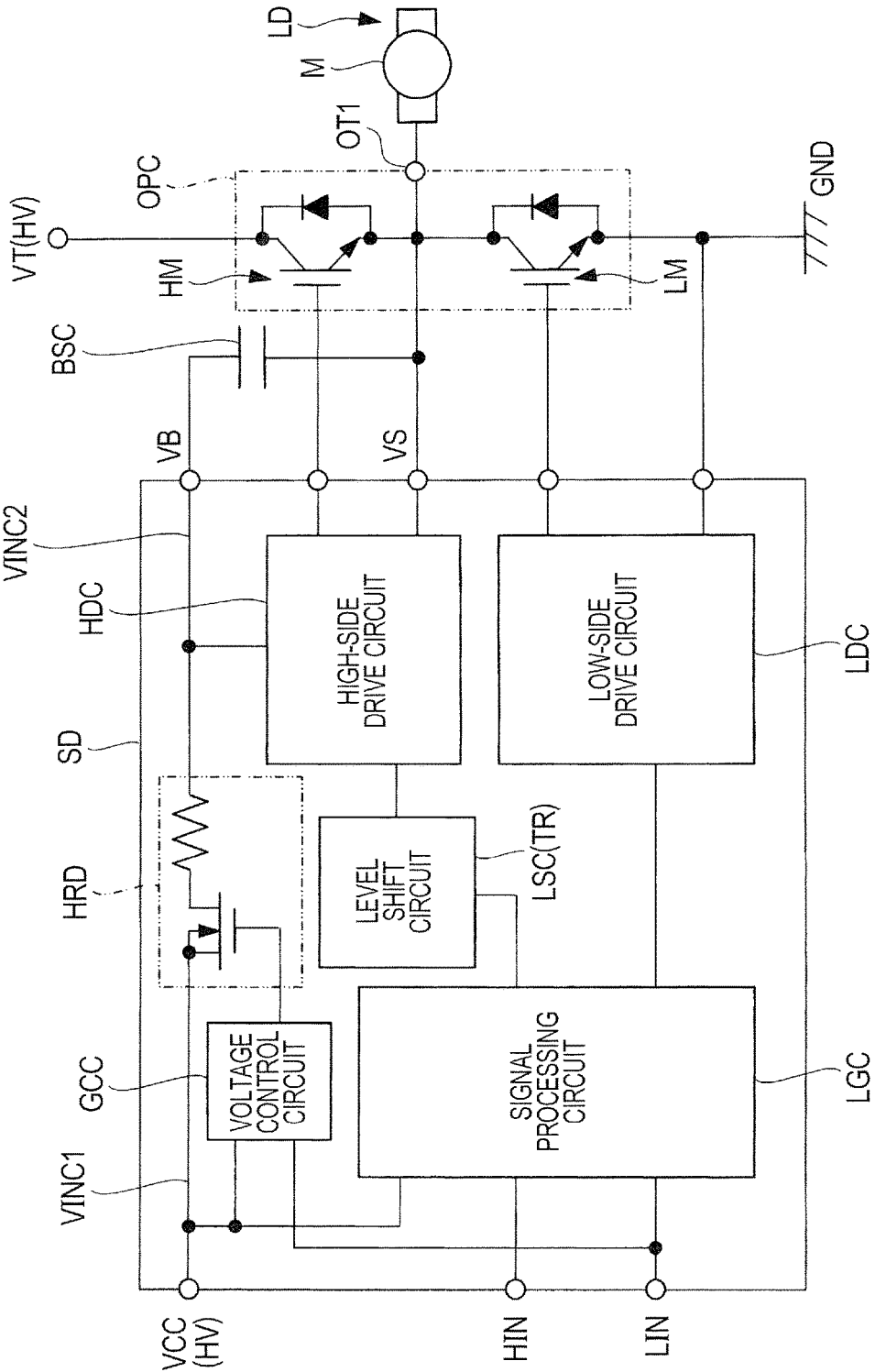
FIG. 1 is a functional block diagram of electronic equipment in which a semiconductor device in Embodiment 1 is used.

In the following embodiment, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe representative embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration.

Embodiment 1

A description will be given first of a semiconductor device in Embodiment 1. In the semiconductor device in Embodiment 1, control circuits each of which generates a control signal for a power semiconductor element are integrated.

The semiconductor device in Embodiment 1 includes a control circuit supplied with a lower power supply potential and a control circuit supplied with a higher power supply potential, as described above. To transmit the control signal between the control circuit supplied with the lower power supply potential and the control circuit supplied with the higher power supply potential, a level shift circuit for shifting a voltage level is provided. The level shift circuit has a level shifter made of a MOSFET as a coupling transistor which couples the control circuit supplied with the lower power supply potential to the control circuit supplied with the higher power supply potential.

The following will describe an example in which the semiconductor device has, as the coupling transistor as the level shifter, a coupling transistor which inputs the signal output from a HIGH-side drive circuit HDC to a signal processing circuit LGC. In such a case, the coupling transistor is made of a p-channel MOSFET.

<Electronic Equipment Using Semiconductor Device in Embodiment 1>

Next, a description will be given of electronic equipment using the semiconductor device in Embodiment 1. FIG. 1 is a functional block diagram of the electronic equipment using the semiconductor device in Embodiment 1

The electronic equipment shown in FIG. 1 includes a semiconductor device SC, a power control circuit OPC, a higher-voltage power supply HV having a power supply potential VT, and a load LD. The semiconductor device SD is coupled to the power control circuit OPC and the higher-voltage power supply HV is coupled to the power control circuit OPC. The power control circuit OPC is coupled to the load LD. The power control circuit OPC controls the power supplied from the higher-voltage power supply HV to the load LD made of, e.g., a motor M. The semiconductor device SD supplies a control signal for controlling the power control circuit OPC to the power control circuit OPC. That is, the semiconductor device SD controls the power supplied from the higher-voltage power supply HV to the load LD via the power control circuit OPC.

The power control circuit OPC includes a plurality of transistors made of, e.g., MOS transistors such as, e.g., planar-gate or trench-gate vertical MOS transistors, bipolar transistors, or IGBTs (Insulated Gate Bipolar Transistors). In the example shown in FIG. 1, the power control circuit OPC has a higher-voltage (HIGH-side) transistor HM as an IGBT and a lower-voltage (LOW-side) transistor LM. The HIGH-side transistor HM and the LOW-side transistor LM are coupled in series between the higher-voltage power supply HV having the power supply potential VT and a ground line having a ground potential GND. The collector of the HIGH-side transistor HM is coupled to the higher-voltage power supply HV having the power supply potential VT. The emitter of the HIGH-side transistor HM is coupled to the collector of the LOW-side transistor LM. The emitter of the LOW-side transistor LM is coupled to the ground line having the ground potential GND. The power control circuit OPC has an output terminal OT1 provided between the HIGH-side transistor HM and the LOW-side transistor LM. The output terminal OT1 is coupled to the load LD.

The semiconductor device SD includes the signal processing circuit LGC, a level-shift circuit LSC, a HIGH-side drive circuit HDC, and a LOW-side drive circuit LDC. The HIGH-side drive circuit HDC is coupled to the gate electrode of the transistor HM of the power control circuit OPC. The LOW-side drive circuit LDC is coupled to the gate electrode of the transistor LM of the power control circuit OPC. The HIGH-side drive circuit HDC and the LOW-side drive circuit LDC are controlled by the signal processing circuit LGC.

The signal processing circuit LGC is a logic circuit and generates a control signal for controlling the load LD in accordance with the signal input thereto from the outside. The control circuit includes a signal which controls the LOW-side drive circuit LDC and a signal which controls the HIGH-side drive circuit HDC.

The power supply potential supplied to the LOW-side drive circuit LDC is substantially equal to the power supply potential supplied to the signal processing circuit LGC. Accordingly, the signal processing circuit LGC is coupled to the LOW-side drive circuit LDC without interposition of the level shift circuit LSC. On the other hand, the power supply potential supplied to the HIGH-side drive circuit HDC is higher than the power supply potential supplied to the signal processing circuit LGC. Accordingly, the signal processing circuit LGC is coupled to the HIGH-side drive circuit HDC via the level shift circuit LSC. The level shift circuit LSC includes a coupling transistor TR which will be described later using FIGS. 2 to 4.

A power supply potential (power supply voltage applied to the HIGH-side drive circuit HDC) VB supplied to the HIGH-side drive circuit HDC is generated from a power supply voltage (power supply voltage applied to the signal processing circuit LGC) VCC. The power supply potential VB is generated from the power supply potential VCC by a rectifying element HRD, the power control circuit OPC, and a capacitive element BSC. The capacitive element BSC is made of, e.g., a bootstrap capacitor. One of the terminals of the capacitive element BSC is coupled to an output terminal OT1 of the power control circuit OPC. The other of the terminals of the capacitive element BSC is coupled to a power supply line VINC2 of the HIGH-side drive circuit HDC.

In the present specification, it is assumed that the power supply voltage applied to a given portion means the difference between the power supply potential applied to the portion and a ground potential and is equal to the power supply potential applied to the portion.

Between the power supply line VINC2 and a power supply line VINC1, the rectifying terminal HRD is provided. To the rectifying terminal HRD, a voltage control circuit GCC is coupled. The voltage control circuit GCC inputs a signal to the rectifying terminal HRD.

Note that, to the signal processing circuit LGC, a control signal HIN for controlling the transistor HM and a control signal LIN for controlling the transistor LM are input. The signal processing circuit LGC controls the HIGH-side drive circuit HDC on the basis of the control signal HIN and controls the LOW-side drive circuit LDC on the basis of the control signal LIN.

The control signal LIN is input also to the voltage control circuit GCC. The voltage control circuit GCC inputs a signal to the rectifying element HRD on the basis of the control signal LIN and therefore synchronizes the signal to be input to the rectifying element HRD with the turning ON/OFF of the transistor LM. Instead of the control signal LIN, the control signal HIN may also be used herein. In this case, the signal to be input to the rectifying element HRD can be synchronized with the ON/OFF of the transistor HM.

<Configuration of Semiconductor Device in Embodiment 1>

Figure 2:
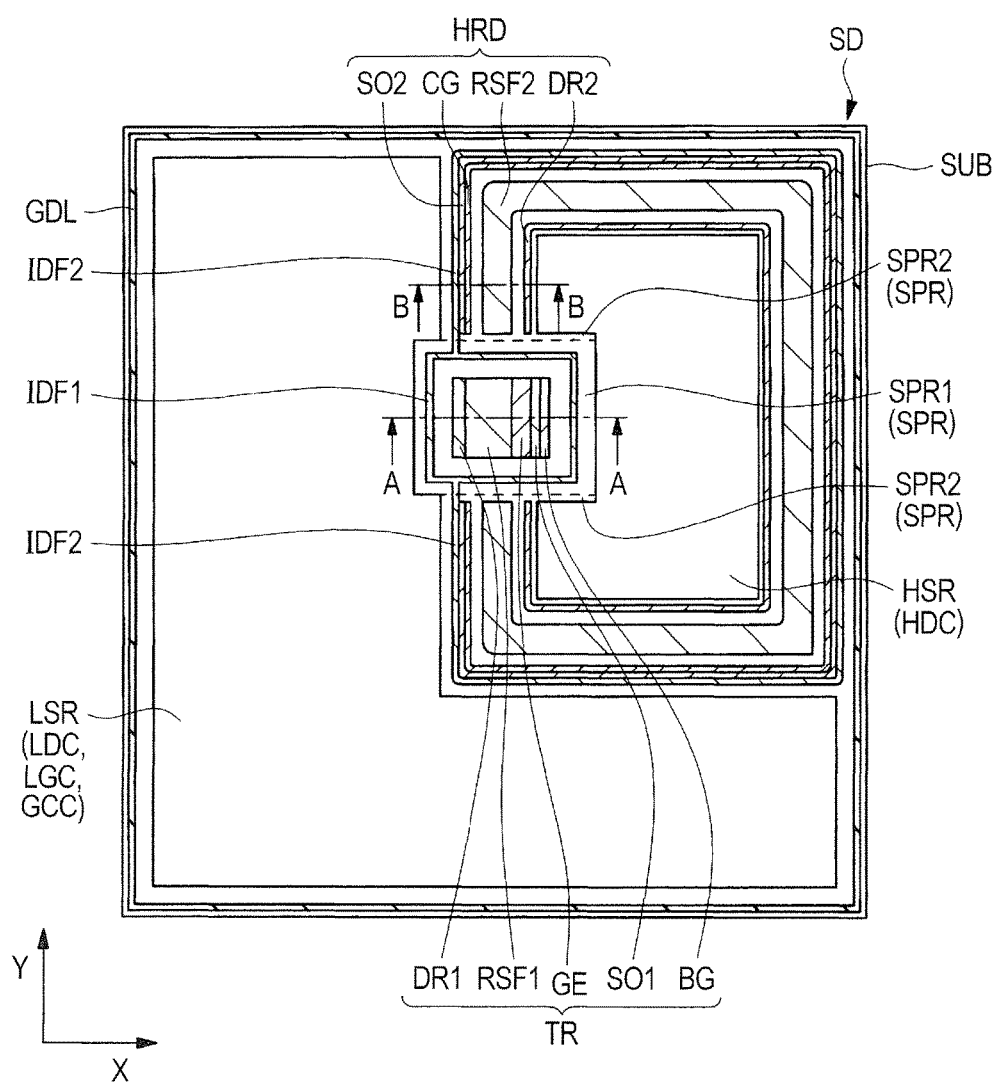
FIG. 2 is a plan view showing a configuration of the semiconductor device in Embodiment 1.
Figure 3:
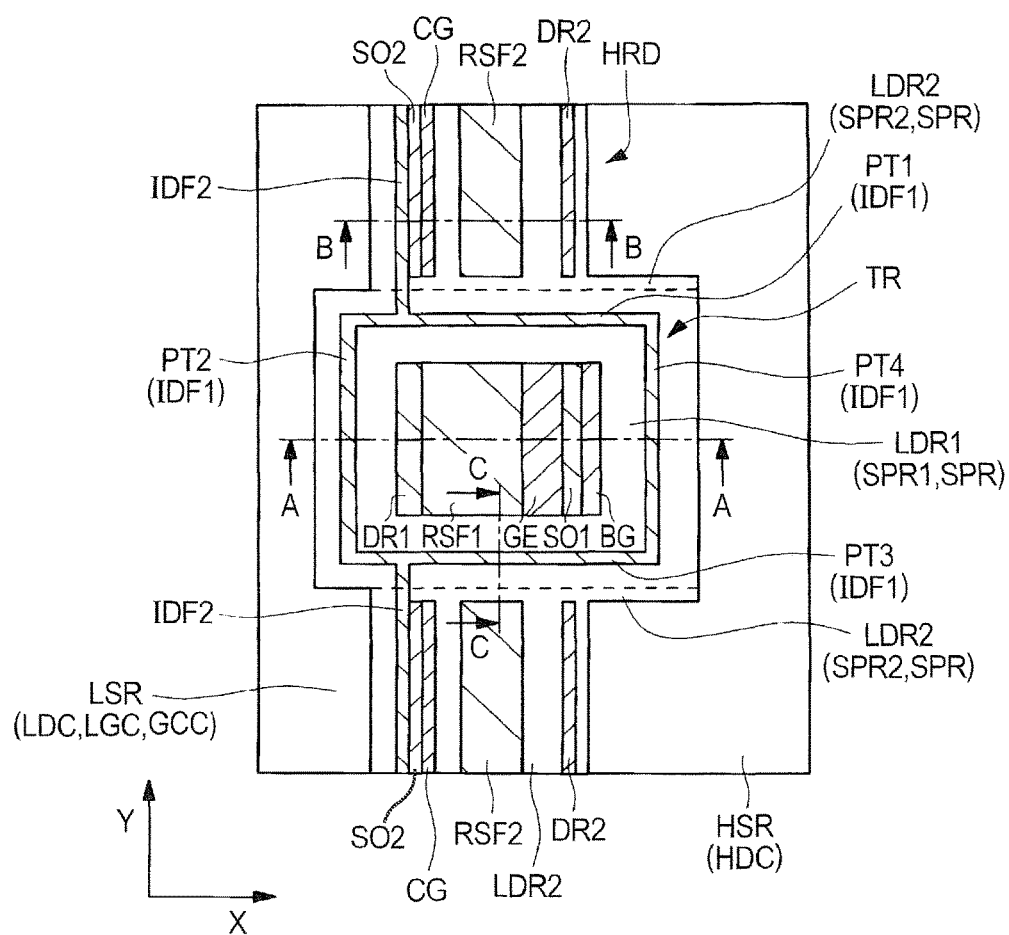
FIG. 3 is a main-portion plan view of the semiconductor device in Embodiment 1.
Figure 4:
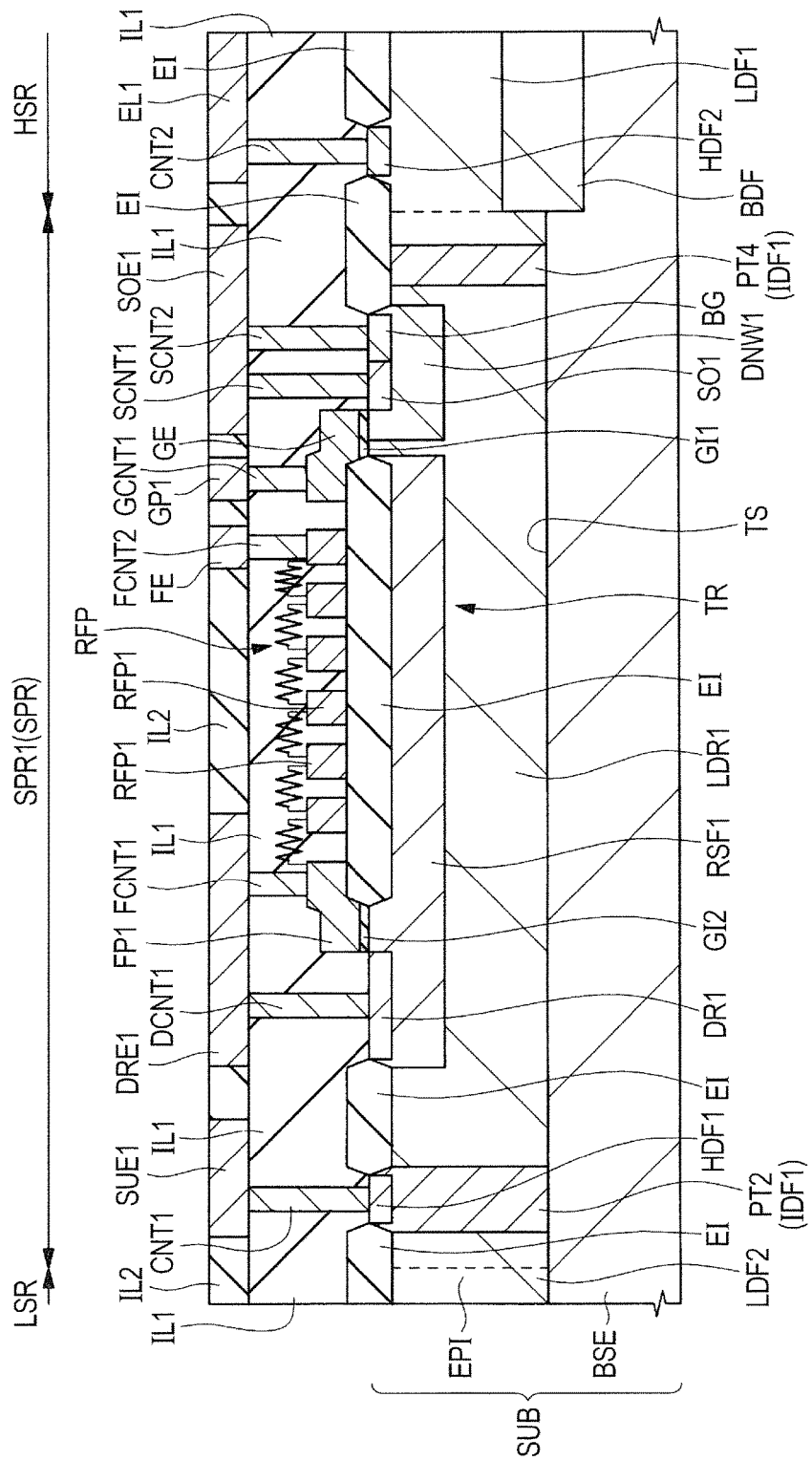
FIG. 4 is a main-portion cross-sectional view of the semiconductor device in Embodiment 1.
Figure 5:
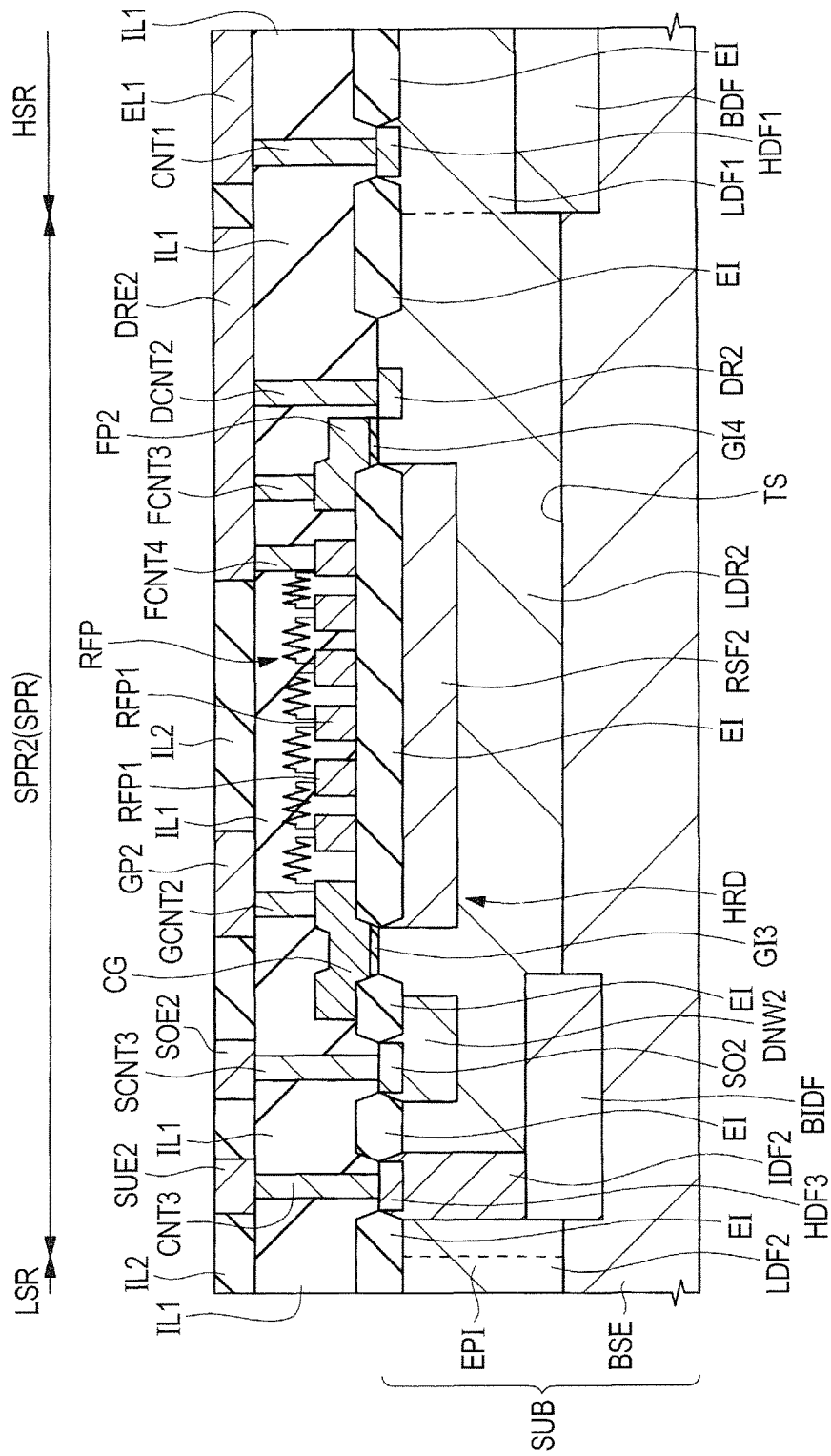
FIG. 5 is a main-portion cross-sectional view of the semiconductor device in Embodiment 1.

Next, a description will be given of a configuration of the semiconductor device in Embodiment 1. FIG. 2 is a plan view showing the configuration of the semiconductor device in Embodiment 1. FIG. 3 is a main-portion plan view of the semiconductor device in Embodiment 1. FIGS. 4 and 5 are main-portion cross-sectional views of the semiconductor device in Embodiment 1.

FIG. 3 shows the periphery of the coupling transistor TR in FIG. 2 in enlarged relation. FIG. 4 is a cross-sectional view along the line A-A in each of FIGS. 2 and 3. FIG. 5 is a cross-sectional view along the line B-B in each of FIGS. 2 and 3.

As shown in FIGS. 2 to 5, the semiconductor device SD in Embodiment 1 has a substrate SUB, a higher-voltage circuit region HSR, an isolation region SPR, and a lower-voltage circuit region LSR. In plan view, a guard ring GDL is formed along the outer periphery of the substrate SUB. The higher-voltage circuit region HSR, the isolation region SPR, and the lower-voltage circuit region LSR are disposed in the region enclosed by the guard ring GDL.

The substrate SUB includes a base BSE as a p-type semiconductor substrate and an $n^-$-type semiconductor layer EPI formed over the base BSE. The base BSE has, as partial regions of an upper surface TS as a main surface of the base BSE, the higher-voltage circuit region HSR, the isolation region SPR, and the lower-voltage circuit region LSR. The base BSE is made of, e.g., a silicon (Si) monocrystalline substrate. The $n^-$-type semiconductor layer EPI has been epitaxially grown over, e.g., the upper surface TS as the main surface of the base BSE.

In the higher-voltage circuit region HSR, over the $n^-$-type semiconductor layer EPI, i.e., over the base BSE, the HIGH-side drive circuit HDC is formed. In the lower-voltage circuit region LSR and over the $n^-$-type semiconductor layer EPI, i.e., over the base BSE, the LOW-side drive circuit LDC and the signal processing circuit LGC are formed. The power supply potential supplied to the HIGH-side drive circuit HDC is higher than each of the power supply potential supplied to the LOW-side drive circuit LDC and the power supply potential supplied to the signal processing circuit LGC. That is, the power supply potential supplied to the higher-voltage circuit region HSR is higher than the power supply potential supplied to the lower-voltage circuit region LSR.

The periphery of the higher-voltage circuit region HSR is surrounded by the isolation region SPR. That is, the higher-voltage circuit region HSR and the lower-voltage circuit region LSR are isolated by the isolation region SPR. This allows the plurality of circuits to which the different power supply potentials are supplied to be formed in the same substrate SUB.

In the example shown in FIG. 2, each of the substrate SUB and the higher-voltage circuit region HSR is substantially rectangular. The higher-voltage circuit region HSR is located proximate to one corner portion of the substrate SUB. Between each of one long side (the right side in FIG. 2) of the higher-voltage circuit region HSR and one shorter side (the upper side in FIG. 2) thereof and the side of the substrate SUB which is closest to the side, no other circuit is disposed.

In the isolation region SPR, the coupling transistor TR is formed in the n⁻-type semiconductor layer EPI. The coupling transistor TR inputs, i.e., transmits the signal input thereto from the HIGH-side drive circuit HDC formed in the higher-voltage circuit region HSR to the signal processing circuit LGC formed in the lower-voltage circuit region LSR.

As described above, in the example shown in FIG. 2, the isolation region SPR is formed along the edge of the higher-voltage circuit region HSR having the rectangular shape. Also, in the example shown in FIG. 2, the coupling transistor TR is formed in the portion of the isolation region SPR which is along the other long side (left side in FIG. 2) of the higher-voltage circuit region HSR having the rectangular shape. However, the position where the coupling transistor TR is formed is not limited to that in the example shown in FIG. 2.

The coupling transistor TR includes an n⁻-type semiconductor region LDR1, a gate insulating film GI1, a gate electrode GE, a source region SO1 as a p⁺-type semiconductor region, a resurf layer RSF1 as a p-type semiconductor region, and a drain region DR1 as a p⁺-type semiconductor region. In other words, the n⁻-type semiconductor region LDR1, the gate insulating film GI1, the gate electrode GE, the source region SO1, the resurf layer RSF1, and the drain region DR1 form the coupling transistor TR. The coupling transistor TR is a p-channel MOSFET.

The n⁻-type semiconductor region LDR1 includes a portion of the n⁻-type semiconductor layer EPI which is located in a region SPR1 of the isolation region SPR where the coupling transistor TR is formed. It is assumed that the region SPR1 includes the region surrounded by a p-type semiconductor region IDF1 described later and the region where the p-type semiconductor region IDF1 is formed.

The gate insulating film GI1 is formed over the n⁻-type semiconductor region LDR1 in the region SPR1 of the isolation region SPR. The gate electrode GE is formed over the gate insulating film GI1. The gate insulating film GI1 is made of, e.g., silicon dioxide ($SiO_2$). The gate electrode GE is made of, e.g., polycrystalline silicon (polysilicon).

The source region SO1 is formed in the upper-layer portion of the part of the n⁻-type semiconductor region LDR1 which is located closer to the higher-voltage circuit region HSR than the gate electrode GE in the region SPR1 of the isolation region SPR. The resurf layer RSF1 is formed in the upper-layer portion of the part of the n⁻-type semiconductor region LDR1 which is located closer to the lower-voltage circuit region LSR than the gate electrode GE in the region SPR1 of the isolation region SPR. The drain region DR1 is formed in the upper-layer portion of the part of the resurf layer RSF1 which is located opposite to the gate electrode GE.

A p-type impurity concentration in the source region SO1 is higher than a p-type impurity in the resurf layer RSF1. A p-type impurity concentration in the drain region DR1 is higher than the p-type impurity concentration in the resurf layer RSF1.

As shown in FIGS. 2 and 3, in the vicinity of the region SPR1 of the isolation region SPR, a direction intersecting and preferably orthogonal to a direction along the outer periphery of the higher-voltage circuit region HSR is assumed to be an X-axis direction and the direction along the outer periphery of the higher-voltage circuit region HSR is assumed to be a Y-axis direction. That is, the Y-direction is a direction intersecting and preferably orthogonal to the X-axis direction. When the X-axis direction is assumed to be the gate length direction of the gate electrode GE of the coupling transistor TR, the source region SO1, the gate electrode GE, the resurf layer RSF1, and the drain region DR1 are arranged in the X-axis direction. Specifically, the source region SO1, the gate electrode GE, the resurf layer RSF1, and the drain region DR1 are arranged in this order of increasing distance from the higher-voltage circuit region HSR toward the lower-voltage circuit region LSR in the X-axis direction.

At this time, in the higher-voltage circuit region HSR located on one side of the isolation region SPR in the X-axis direction in plan view (on the right side in FIG. 2), e.g., the HIGH-side drive circuit HDC (see FIG. 1) as a circuit portion is formed over the base BSE. Also, in the lower-voltage circuit region LSR located on the side of the isolation region SPR which is opposite to the one side thereof in the X-axis direction in plan view (on the left side in FIG. 2), e.g., the signal processing circuit LGC as the circuit portion is formed over the base BSE.

The length of the resurf layer RSF1 in the X-axis direction, i.e., in the gate length direction is longer than the length of the source region SO1 in the X-axis direction. The resurf layer RSF1 functions as a drift region.

Note that the direction in which the source region SO1, the gate electrode GE, the resurf layer RSF1, and the drain region DR1 are arranged, i.e., the gate length direction of the coupling transistor TR need not necessarily be the same as the X-axis direction.

The source region SO1, the resurf layer RSF1, and the drain region DR1 are surrounded by the p-type semiconductor region IDF1. That is, the coupling transistor TR is surrounded by the p-type semiconductor region IDF1. The p-type semiconductor region IDF1 is formed in the portion of the n⁻-type semiconductor region LDR1 which surrounds the source region SO1, the resurf layer RSF1, and the drain region DR1 in plan view to be apart from each of the source region SO1, the resurf layer RSF1, and the drain region DR1.

Preferably, the p-type semiconductor region IDF1 is in contact with the base BSE. This allows the portion of the n⁻-type semiconductor region LDR1 which is surrounded by the p-type semiconductor region IDF1 to be electrically isolated from the part of the n⁻-type semiconductor layer EPI which is located in a region SPR2 of the isolation region SPR other than the region SPR1.

In the isolation region SPR, in the upper-layer portion of the part of the n⁻-type semiconductor region LDR1 which is located closer to the higher-voltage circuit region HSR than the gate electrode GE, an n-type semiconductor region DNW1 may also be formed. Also, in the isolation region, in the upper-layer portion of the part of the n-type semiconductor region DNW1 which is located opposite to the gate electrode GE relative to the source region SO1 interposed therebetween, a back gate BG may also be formed. An n-type impurity concentration in the n⁻-type semiconductor region LDR1 is lower than an n-type impurity concentration in the n-type semiconductor region DNW1.

At this time, the back gate BG, the source region SO1, the gate electrode GE, the resurf layer RSF1, and the drain region DR1 are arranged in this order of increasing distance from the higher-voltage circuit region HSR toward the lower-voltage circuit region LSR. The back gate BG, the source region SO1, the resurf layer RSF1, and the drain region DR1 are surrounded by the p-type semiconductor region IDF1.

Over the resurf layer RSF1, an isolation film EI is formed. The isolation film EI is made of, e.g., a silicon dioxide ($SiO_2$) film. At this time, the part of the gate electrode GE which is closer to the drain region DR1 is formed over the isolation film EI.

The isolation film EI is formed by, e.g., a LOCOS (Local oxidation of silicon) oxidation method. Alternatively, the isolation film EI may also be formed by a STI (Shallow trench isolation) method. The isolation film EI may also be formed in the region SPR2 of the isolation region SPR.

As shown in FIG. 4, in the region SPR1 of the isolation region SPR, a field plate electrode RFP may also be formed over the resurf layer RSF1, though the illustration thereof is omitted in FIGS. 2 and 3. The field plate electrode RFP is disposed so as to surround the periphery of the higher-voltage circuit region HSR in several layers.

In the field plate electrode RFP, a plurality of partial electrodes RFP1 each extending in a direction along the outer periphery of the higher-voltage circuit region HSR are arranged in a direction intersecting the outer periphery of the higher-voltage circuit region HSR. The plurality of arranged partial electrodes RFP1 are coupled in series to each other. The field plate electrode RFP is made of, e.g., aluminum (Al).

Over the part of the resurf layer RSF1 which is located between the field plate electrode RFP and the drain region DR1, a field plate electrode FP1 is formed via an insulating film GI2. The field plate electrode FP1 is electrically coupled to the field plate electrode RFP. The field plate electrode FP1 is made of, e.g., polycrystalline silicon (polysilicon).

In the region SPR1 of the isolation region SPR, over the substrate SUB, an interlayer insulating film IL1 covering the source region SO1, the gate electrode GE, the field plate electrodes RFP and FP1, and the drain region DR1 is formed. The interlayer insulating film IL1 is made of, e.g., silicon dioxide ($SiO_2$).

In the region SPR1 of the isolation region SPR, over the interlayer insulating film IL1, a source electrode SOE1, a gate plate electrode GP1, a field plate electrode FE, and a drain electrode DRE1 are formed. The source electrode SOE1, the gate plate electrode GP1, the field plate electrode FE, and the drain electrode DRE1 are each made of, e.g., aluminum (Al) and formed by the same process steps. Note that, between any adjacent two of the source electrode SOE1, the gate plate electrode GP1, the field plate electrode FE, and the drain electrode DRE1, an interlayer insulating film IL2 is formed.

The source electrode SOE1 is electrically coupled to the source region SO1 via a contact SCNT1 as a coupling electrode extending through the interlayer insulating film IL1. The gate plate electrode GP1 is electrically coupled to the gate electrode GE via a contact GCNT1 as a coupling electrode extending through the interlayer insulating film IL1. The drain electrode DRE1 is electrically coupled to the drain region DR1 via a contact DCNT1 as a coupling electrode extending through the interlayer insulating film IL1.

The source electrode SOE1 is electrically coupled to the back gate BG via a contact SCNT2 as a coupling electrode extending through the interlayer insulating film IL1. As a result, the back gate BG is electrically coupled to the source region SO1 via the contact SCNT2, the source electrode SOE1 as wiring, and the contact SCNT1 as the wiring. The source electrode SOE1 is formed over the source region SO1 and over the back gate BG.

The drain electrode DRE1 is electrically coupled to the field plate electrode FP1 via a contact FCNT1 as a coupling electrode extending through the interlayer insulating film IL1. Consequently, the field plate electrode RFP is electrically coupled to the drain electrode DRE1 via the field plate electrode FP1 and the contact FCNT1. As a result, the field plate electrode RFP is electrically coupled to the drain electrode DRE1 of the coupling transistor TR at the portion of the isolation region SPR which is located closer to the lower-voltage circuit region LSR than the middle of the isolation region SPR in the widthwise direction thereof (X-axis direction in each of FIGS. 2 and 3).

On the other hand, the field plate electrode RFP is electrically coupled to the field plate electrode FE at the portion of the isolation region SPR which is located closer to the higher-voltage circuit region HSR than the middle of the isolation region SPR in the widthwise direction thereof (the X-axis direction in each of FIGS. 2 and 3). To the field plate electrode FE, a ground potential or a power supply potential to the signal processing circuit LGC is supplied. It is assumed that, in the following description, the ground potential is supplied to the field plate electrode FE.

It is preferable that, of the field plate electrode RFP, the outermost peripheral portion, i.e., the portion located closer to the lower-voltage circuit region LSR is coupled to the drain electrode DRE1 of the coupling transistor TR. It is also preferable that, of the field plate electrode RFP, the innermost peripheral portion, i.e., the portion located closer to the higher-voltage circuit region HSR is electrically coupled to the field plate electrode FE. In such a case, it is possible to allow the major part of the field plate electrode RFP to have a potential gradient along the extending direction of the field plate electrode RFP. This enhances the effect of inhibiting the concentration of an electric field using the field plate electrode RFP.

Note that, in the isolation region SPR, as the coupling transistor, not only a transistor which inputs, i.e., transmits the signal output from the HIGH-side drive circuit HDC to the signal processing circuit LGC, but also a transistor which inputs, i.e., transmits the signal input thereto from the signal processing circuit LGC to the HIGH-side drive circuit HDC may also be formed. In such a case, the coupling transistor is made of an n-channel MOSFET. The signal processing circuit LGC is coupled to the gate electrode of the coupling transistor, while the HIGH-side drive circuit HDC is coupled to the drain of the coupling transistor.

In the region SPR1 of the isolation region SPR, in the upper-layer portion of the part of the p-type semiconductor region IDF1 which is located, e.g., closer to the lower-voltage circuit region LSR than the coupling transistor TR, a $p^+$-type semiconductor region HDF1 is formed. A p-type impurity concentration in the $p^+$-type semiconductor region HDF1 is higher than a p-type impurity concentration in the p-type semiconductor region IDF1.

In the region SPR1 of the isolation region SPR, over the interlayer insulating film IL1, an electrode SUE1 is formed. The electrode SUE1 is made of, e.g., aluminum (Al) and formed in the same process steps as those of forming, e.g., the drain electrode DRE1. The electrode SUE1 is electrically coupled to the $p^+$-type semiconductor region HDF1 via the contact CNT1 as a coupling electrode extending through the interlayer insulating film IL1.

In the higher-voltage circuit region HSR, over the substrate SUB, an $n^-$-type semiconductor region LDF1 is formed. The $n^-$-type semiconductor region LDF1 includes the portion of the $n^-$-type semiconductor layer EPI which is located in the higher-voltage circuit region HSR.

In the higher-voltage circuit region HSR, in the upper-layer portion of the base BSE and in the lower-layer portion of the $n^-$-type semiconductor region LDF1, an embedded diffusion layer BDF as an n-type semiconductor region is formed. An n-type impurity concentration in the $n^-$-type semiconductor region LDF1 is lower than an n-type impurity concentration in the embedded diffusion layer BDF.

In the higher-voltage circuit region HSR, over the $n^-$-type semiconductor region LDF1, the isolation films EI are formed. In the higher-voltage circuit region HSR, in the upper-layer portion of the part of the $n^-$-type semiconductor layer EPI which is located between the two isolation films EI adjacent to each other, an $n^+$-type semiconductor region HDF2 is formed. An n-type impurity concentration in the $n^+$-type semiconductor region HDF2 is higher than an n-type impurity concentration in the $n^-$-type semiconductor region LDF1.

In the higher-voltage circuit region HSR, over the substrate SUB, the interlayer insulating film IL1 covering the $n^+$-type semiconductor region HDF2 is formed. Over the interlayer insulating film IL1, an electrode EL1 is formed. The electrode EL1 is made of, e.g., aluminum (Al) and formed in the same process steps as those of forming, e.g., the source electrode SOE1. The electrode EL1 is electrically coupled to the $n^+$-type semiconductor region HDF2 via a contact CNT2 as a coupling electrode extending through the interlayer insulating film IL1. The electrode EL1 is electrically coupled to the higher-voltage power supply HV (see FIG. 1) having the power supply potential VT so that the power supply potential VT is supplied from the higher-voltage power supply HV to the electrode EL1. Consequently, to the $n^-$-type semiconductor region LDF1, the power supply potential VT is supplied from the higher-potential power supply HV via the electrode EL1.

Note that, in the lower-voltage circuit region LSR, over the substrate SUB, an $n^-$-type semiconductor region LDF2 is formed. The $n^-$-type semiconductor region LDF2 includes the portion of the $n^-$-type semiconductor layer EPI which is located in the lower-voltage circuit region LSR.

As shown in FIG. 5, in the region SPR2 of the isolation region SPR other than the region SPR1, the rectifying element HRD is formed. The rectifying element HRD is an n-channel MOSFET and has the function of a bootstrap diode.

The rectifying element HRD has an $n^-$-type semiconductor region LDR2, a gate insulating film GI3, a control gate electrode CG, a source region SO2 as an $n^+$-type semiconductor region, a drain region DR2 as an $n^+$-type semiconductor region, and a resurf layer RSF2 as a p-type semiconductor region. In other words, the $n^-$-type semiconductor region LDR2, the gate insulating film GI3, the control gate electrode CG, the source region SO2, the drain region DR2, and the resurf layer RSF2 form the rectifying element HRD as the transistor. The rectifying element HRD is an n-channel complete-depletion-type MOSFET.

In a current path in which a current flows in the rectifying element HRD, no pn junction is formed. Accordingly, a recovery time during which minority carries can flow in a direction reverse to a forward direction in a pn junction, i.e., a reverse recovery time is zero in principle, resulting in a high carrier mobility. Note that, as shown in FIG. 1, the rectifying element HRD may also have a resistor coupled in series to the n-channel MOSFET.

The $n^-$-type semiconductor region LDR2 includes the portion of the $n^-$-type semiconductor layer EPI which is located in the region SPR2 of the isolation region SPR. It is assumed that the region SPR2 means the area of the isolation region SPR other than the area thereof surrounded by the p-type semiconductor region IDF1 and the area thereof where the p-type semiconductor region IDF1 is formed.

The gate insulating film IG3 is formed over the $n^-$-type semiconductor region LED2 in the region SPR2 of the isolation region SPR to be apart from the p-type semiconductor region IDF1. The control gate electrode CG is formed over the gate insulating film GI3. The gate insulating film GI3 is made of, e.g., a silicon dioxide ($SiO_2$). The control gate electrode CG is made of, e.g., polycrystalline silicon (polysilicon).

The source region SO2 is formed in the upper-layer portion of the part of the $n^-$-type semiconductor region LDR2 which is located closer to the lower-voltage circuit region LSR than the control gate electrode CG in the region SPR2 of the isolation region SPR. The drain region DR2 is formed in the upper-layer portion of the part of the $n^-$-type semiconductor region LDR2 which is located closer to the higher-voltage circuit region HSR than the control gate electrode CG in the region SPR2 of the isolation region SPR. The resurf layer RSF2 is formed in the upper-layer portion of the part of the $n^-$-type semiconductor region LDR2 which is located closer to the higher-voltage circuit region HSR than the control gate electrode CG in the region SPR2 of the isolation region SPR.

An n-type impurity concentration in the source region SO2 is higher than an n-type impurity concentration in the $n^-$-type semiconductor region LDR2. An n-type impurity in the drain region DR2 is higher than the n-type impurity concentration in the $n^-$-type semiconductor region LDR2.

When the X-axis direction described above is assumed to be the gate length direction of the control gate electrode CG of the rectifying element HRD, the source region SO2, the control gate electrode CG, the resurf layer RSF2, and the drain region DR2 are arranged in the X-axis direction. Specifically, the source region SO2, the control gate electrode CG, the resurf layer RSF2, and the drain region DR2 are arranged in this order of increasing distance from the lower-voltage circuit region LSR toward the higher-voltage circuit region HSR in the X-axis direction.

Note that the direction in which the source region SO2, the control gate electrode CG, the resurf layer RSF2, and the drain region DR2 are arranged, i.e., the gate length direction of the rectifying element HRD may appropriately be a direction intersecting at least the Y-axis direction and need not necessarily be the same as the X-axis direction.

Over the resurf layer RSF2, the isolation film EI is formed. The isolation film EI is made of, e.g., a silicon dioxide ($SiO_2$) film. At this time, the portion of the control gate electrode CG which is closer to the drain region DR2 is formed over the isolation film EI.

It may also be possible that, in the region SPR2 of the isolation region SPR, an n-type semiconductor region DNW2 is formed in the upper-layer portion of the part of the n⁻-type semiconductor region LDR2 which is located closer to the lower-voltage circuit region LSR than the control gate electrode CG and the source region SO2 is formed in the upper-layer portion of the n-type semiconductor region DNW2. An n-type impurity concentration in the n-type semiconductor region DNW2 is higher than an n-type impurity concentration in the n⁻-type semiconductor region LDR2 and lower than an n-type impurity concentration in the source region SO2.

It may also be possible that, in the region SPR2 of the isolation region SPR, in the same manner as in the region SPR1, the field plate electrode RFP and a field plate electrode FP2 are formed over the resurf layer RSF2. Note that a part of the field plate electrode FP2 is formed over the n⁻-type semiconductor region LDR2 via an insulating film GI4.

In the region SPR2 of the isolation region SPR, over the substrate SUB, the interlayer insulating film IL1 covering the source region SO2, the control gate electrode CG, the field plate electrodes RFP and FP2, and the drain region DR2 is formed. Over the interlayer insulating film IL2, a source electrode SOE2, a gate plate electrode GP2, and a drain region DRE2 are formed. The source electrode SOE2, the gate plate electrode GP2, and the drain electrode DRE2 are each made of, e.g., aluminum (Al) and formed in the same process steps. Note that, between any two of the source electrode SOE2, the gate plate electrode GP2, and the drain electrode DRE2, the interlayer insulating film IL2 is formed.

The source electrode SOE2 is electrically coupled to the source region SO2 via a contact SCNT3 as a coupling electrode extending through the interlayer insulating film IL1. The gate plate electrode GP2 is electrically coupled to the control gate electrode CG via a contact GCNT2 as a coupling electrode extending through the interlayer insulating film IL2. The drain electrode DRE2 is electrically coupled to the drain region DR2 via a contact DCNT2 as a coupling electrode extending through the interlayer insulating film IL1.

The gate plate electrode GP2 is electrically coupled to the voltage control circuit GCC (see FIG. 1). The source electrode SOE2 is electrically coupled to a lower-voltage power supply LV having the power supply potential VCC. The drain electrode DRE2 is electrically coupled to the capacitive element BSC made of, e.g., a bootstrap capacitor via the higher-voltage circuit region HSR.

In the n⁻-type semiconductor region LDR2, a p-type semiconductor region IDF2 is formed opposite to the control gate electrode CG relative to the source region SO2 interposed therebetween. The p-type semiconductor region IDF2 is the portion of the region SPR2 of the isolation region SPR which surrounds the higher-voltage circuit region HSR and is formed in the outermost peripheral portion. This can electrically isolate the n⁻-type semiconductor region LDR2 from the portion of the n⁻-type semiconductor layer EPI which is located in the lower-voltage circuit region LSR.

In the portion of the isolation region SPR which corresponds to a part of the region SPR2 and overlaps the p-type semiconductor region IDF2, an embedded diffusion layer BIDF as a p-type semiconductor region is formed in the upper-layer portion of the base BSE and in the lower-layer portion of the n⁻-type semiconductor region LDR2. The p-type semiconductor region IDF2 is in contact with the base BSE via the embedded diffusion layer BIDF. This can electrically isolate the n⁻-type semiconductor region LDR2 from the portion of the n⁻-type semiconductor layer EPI which is located in the lower-voltage circuit region LSR.

In the region SPR2 of the isolation region SPR, a p⁺-type semiconductor region HDF3 is formed in the upper-layer portion of the p-type semiconductor region IDF2. A p-type impurity concentration in the p⁺-type semiconductor region HDF3 is higher than a p-type impurity concentration in the p-type semiconductor region IDF2.

In the region SPR2 of the isolation region SPR, over the interlayer insulating film IL1, an electrode SUE2 is formed. The electrode SUE2 is made of, e.g., aluminum (Al) and formed in the same process steps as those of forming, e.g., the source electrode SOE2. The electrode SUE2 is electrically coupled to the p⁺-type semiconductor region HDF3 via a contact CNT3 as a coupling electrode extending through the interlayer insulating film IL1.

<Operation of Semiconductor Device in Embodiment 1>

Figure 6:
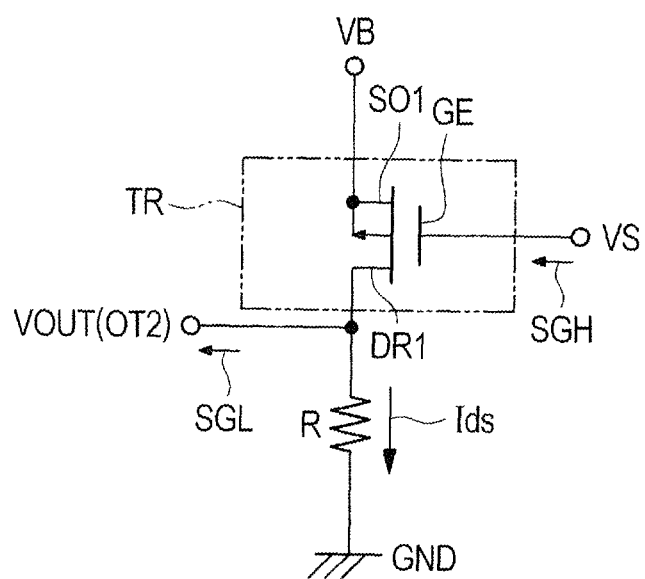
FIG. 6 is an equivalent circuit diagram of the periphery of a coupling transistor in the semiconductor device in Embodiment 1.
Figure 7:
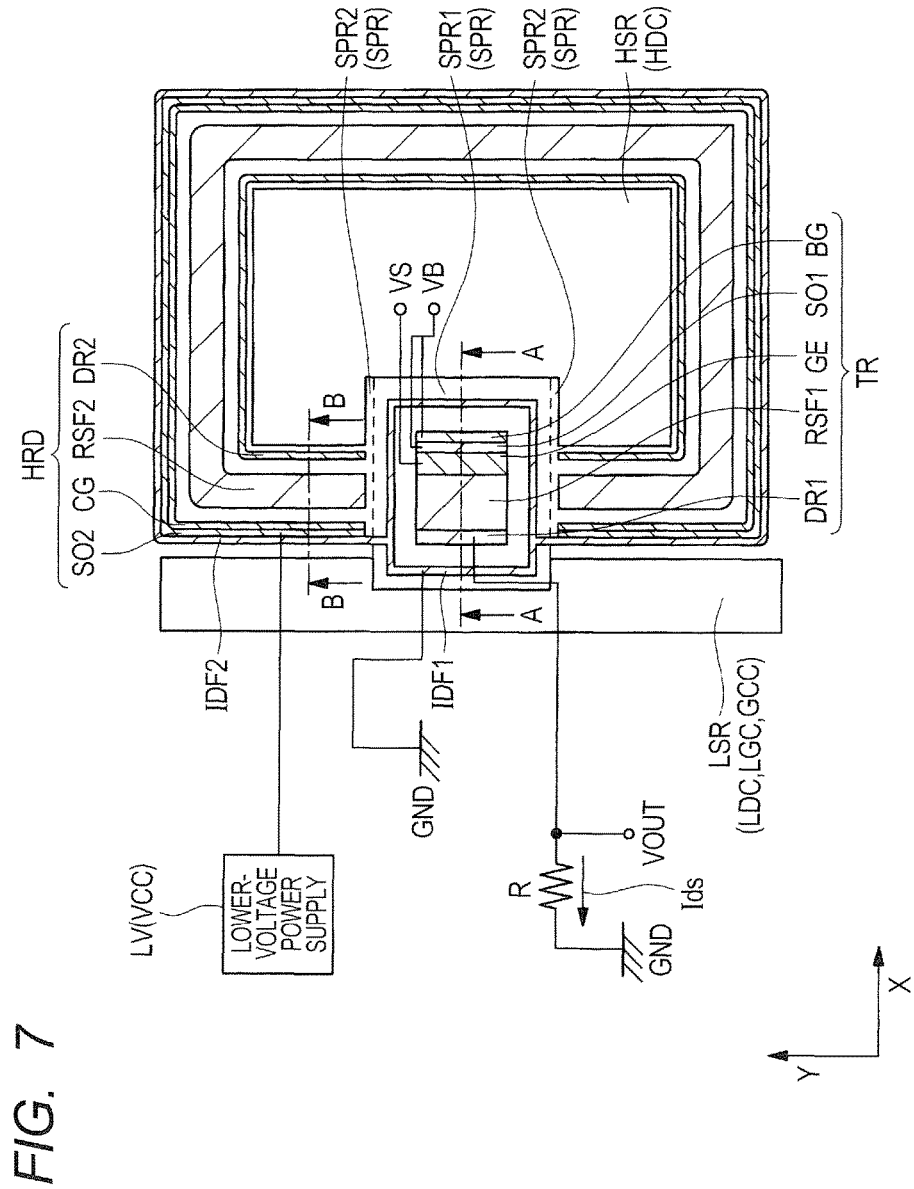
FIG. 7 is a main-portion plan view of the semiconductor device in Embodiment 1.
Figure 8:
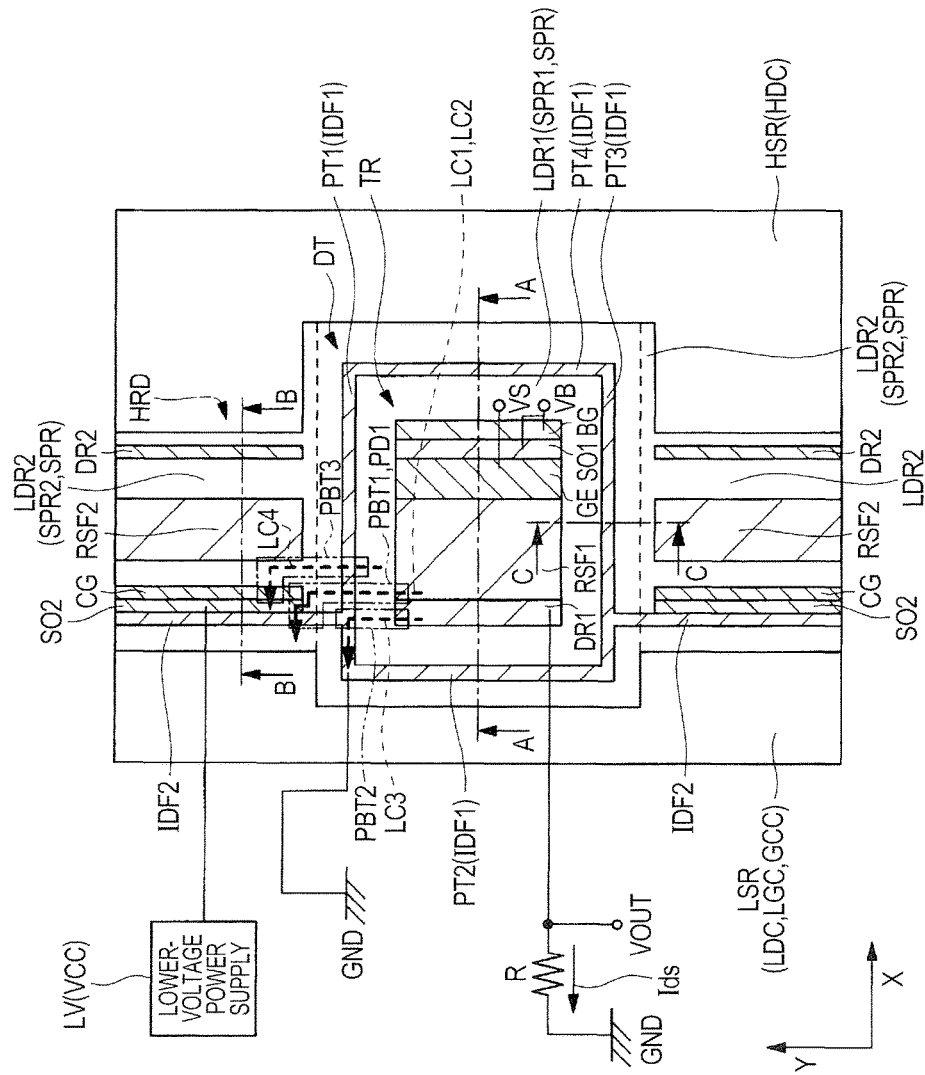
FIG. 8 is a main-portion plan view of the semiconductor device in Embodiment 1.

Next, a description will be given of an operation of the semiconductor device SD according to Embodiment 1 with reference to FIGS. 1 and 4 to 8. FIG. 6 is an equivalent circuit diagram around the coupling transistor in the semiconductor device in Embodiment 1. FIGS. 7 and 8 are main-portion plan views of the semiconductor device in Embodiment 1.

FIG. 7 shows the periphery of the coupling transistor TR in FIG. 2. FIG. 8 shows the periphery of the coupling transistor TR in FIG. 2 in enlarged relation. In FIGS. 7 and 8, the state of electrical coupling of the coupling transistor TR is schematically shown in conjunction with the plan view. FIG. 4 is a cross-sectional view along the line A-A in each of FIGS. 7 and 8. FIG. 5 is a cross-sectional view along the line B-B in each of FIGS. 7 and 8.

As shown in FIG. 6, the source region SO1 of the coupling transistor TR is electrically coupled to a power supply line VINC2 (see FIG. 1) having the power supply potential VB. To the source region SO1, the power supply potential VB is supplied. The gate electrode GE of the coupling transistor TR is electrically coupled to the HIGH-side drive circuit HDC formed in the higher-voltage circuit region HSR and supplied with the reference potential VS in the HIGH-side drive circuit HDC. The reference potential VS is input to the HIGH-side drive circuit HDC from an output terminal OT1 of the power control circuit OPC in the higher-voltage circuit region HSR.

The drain region DR1 of the coupling transistor TR is electrically coupled to the ground line having the ground potential GND via a level shift resistance R. Between the level shift resistance R and the drain region DR1, an output terminal OT2 is provided. The output terminal OT2 is electrically coupled to the signal processing circuit LGC formed in the lower-voltage circuit region LSR. That is, the coupling transistor TR electrically couples the HIGH-side drive circuit HDC to the signal processing circuit LGC.

Note that the source region SO2 of the rectifying element HRD is electrically coupled to the lower-voltage power supply LV having the power supply potential VCC. To each of the p-type semiconductor regions IDF1 and IDF2, 0 V, i.e., a ground potential is supplied. This is because 0 V, i.e., a ground potential is supplied to the base BSE and each of the p-type semiconductor regions IDF1 and IDF2 is in contact with the base BSE.

First, in a state where no charge is stored in the capacitive element BSC, a lower-level (L-level) control signal HIN is input to the semiconductor device SD and a higher-level (H-level) control signal LIN is input to the semiconductor device SD. This brings the HIGH-side transistor HM of the power control circuit OPC into an OFF state and brings the LOW-side transistor LM of the power control circuit OPC into an ON state. The H-level control signal LIN is input also to the voltage control circuit GCC. The voltage control circuit GCC supplies the power supply potential VCC to the control gate electrode CG of the rectifying element HRD as the n-channel MOSFET.

As a result, electrons as carriers are concentrated on the portion of the n⁻-type semiconductor region LDR2 which is located under the control gate electrode CG, while the portion of the n⁻-type semiconductor region LDR2 which is located between the source region SO2 and the drain region DR2 is brought into a non-depleted state. This brings the rectifying element HRD into the ON state, a current flows between the source region SO2 and the drain region DR2, and a current flows between the lower-voltage power supply LV having the power supply potential VCC and the capacitive element BSC via the rectifying element HRD so that charges are stored in the capacitive element BSC. Note that the electrons which are concentrated when the rectifying element HRD is brought into the ON state are majority carries. Accordingly, a response speed when the rectifying element HRD is brought into the ON state is high.

As the charges are stored in the capacitive element BSC, the potential at the terminal of the capacitive element BSC which is coupled to the power supply line VINC2, i.e., the power supply potential VB gradually rises to be finally equal to the power supply potential VCC in the lower-voltage power supply LV.

Next, in a state where the charges are stored in the capacitive element BSC, the higher-level (H-level) control signal HIN is input to the semiconductor device SD and the lower-level (L-level) control signal LIN is input to the semiconductor device SD. This brings the HIGH-side transistor HM of the power control circuit OPC into the ON state and brings the LOW-side transistor LM of the power control circuit OPC into the OFF state. The L-level control signal LIN is input also to the voltage control circuit GCC. The voltage control circuit GCC supplies a 0 V potential to the control gate electrode CG of the rectifying element HRD as the n-channel MOSFET.

As a result, electrons as carriers are no longer concentrated on the portion of the n⁻-type semiconductor region LDR2 which is located under the control gate electrode CG and the portion of the n⁻-type semiconductor region LDR2 which is located between the source region SO2 and the drain region DR2 is brought into a depleted state. This brings the rectifying element HRD into the OFF state, no current flows between the source region SO2 and the drain region DR2, and no current flows between the lower-voltage power supply LV having the power-supply potential VCC and the capacitive element BSC.

Note that, since the p-type semiconductor region BIDF protrudes under the n⁻-type semiconductor region LDR2, the portion of the n⁻-type semiconductor region LDR2 which is located in the vicinity of the source region SO2 is more likely to be depleted. Accordingly, the response speed when the rectifying element HRD is brought into the OFF state is high.

In addition, since the HIGH-side transistor HM is brought into the ON state and the LOW-side transistor LM is brought into the OFF state, the power supply potential VT is supplied from the higher-voltage power supply HV to the terminal of the capacitive element BSC which is opposite to the terminal thereof coupled to the power supply line VINC2. As a result, a potential at the terminal of the capacitive element BSC which is coupled to the power supply line VINC2, i.e., the power supply potential VB rises until the value thereof is equal to the sum of the power supply potentials VT and VCC. Note that, since the rectifying element HRD is in the OFF state, even when the power supply potential VB in the power supply line VINC2 rises until the value thereof is equal to the sum of the power supply potentials VT and VCC, no current flows between the power supply lines VINC2 and VINC1.

At this time, the reference potential VS in the higher-voltage circuit region HSR is equal to the power supply potential VT. Then, as shown in FIGS. 6 to 8, to the gate electrode GE of the coupling transistor TR, the reference potential VS (the power supply potential VT) in the higher-voltage circuit region HSR is supplied and, to the source region SO1 and the back gate BG of the coupling transistor TR, the power supply potential VB (the sum of the power supply potentials VT and VCC) is supplied. As a result, a drain current Ids flows between the drain region DR1 and the ground line via the level shift resistance R and an output potential VOUT that has risen from the ground potential by the potential equal to the product of the drain current Ids and the level shift resistance R is output. Then, the output potential VOUT output from the output terminal OT2 is input, i.e., transmitted to, e.g., the signal processing circuit LGC formed in the lower-voltage circuit region LSR.

Thus, the coupling transistor TR can level-shift the reference potential VS (power supply potential VT) in the higher-voltage circuit region HSR to the output potential VOUT and transmit the output potential VOUT to the lower-voltage circuit region LSR. Here, by adjusting the level shift resistance R such that, e.g., the output potential VOUT is lower than the reference potential VS (power supply potential VT), the coupling transistor TR can step down (level down) the reference potential VS (power supply potential VT) in the higher-voltage circuit region HRS to the output potential VOUT and transmit the output potential VOUT to the lower-voltage circuit region LSR.

Then, the HIGH-side drive circuit HDC operates, while using the charges stored in the capacitive element BSC. As a result, the charges stored in the capacitive element BSC decrease to zero and the power supply potential VB in the power supply line VINC2 decreases to be equal to, e.g., the power supply potential VT.

Next, in a state where no charge is stored in the capacitive element BSC, the L-level control signal HIN is input again to the semiconductor device SD and the H-level control signal LIN is input again to the semiconductor device SD. In this manner, the operation described above is repeated.

<Semiconductor Device in Comparative Example>

Figure 9:
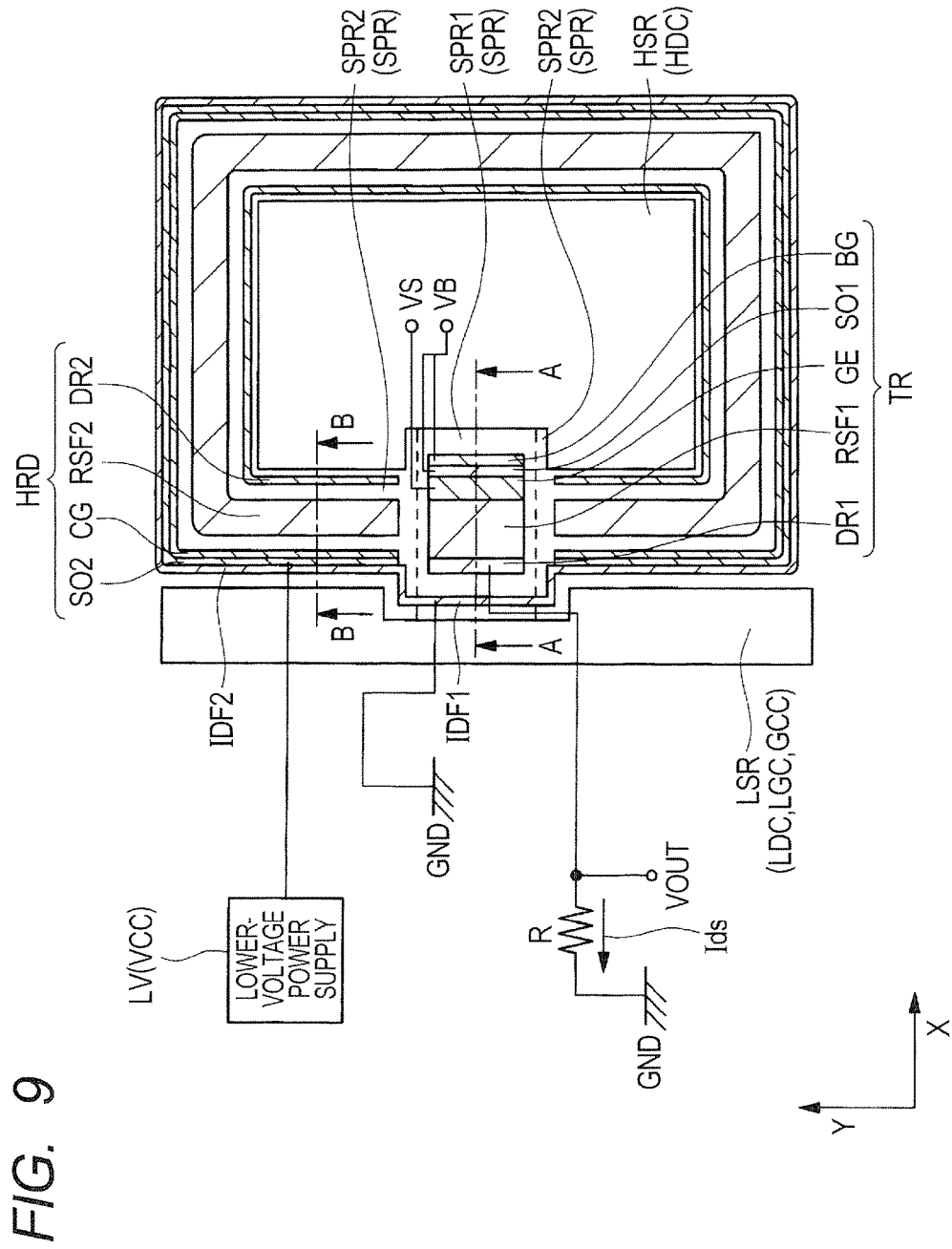
FIG. 9 is a main-portion plan view of a semiconductor device in a comparative example.
Figure 10:
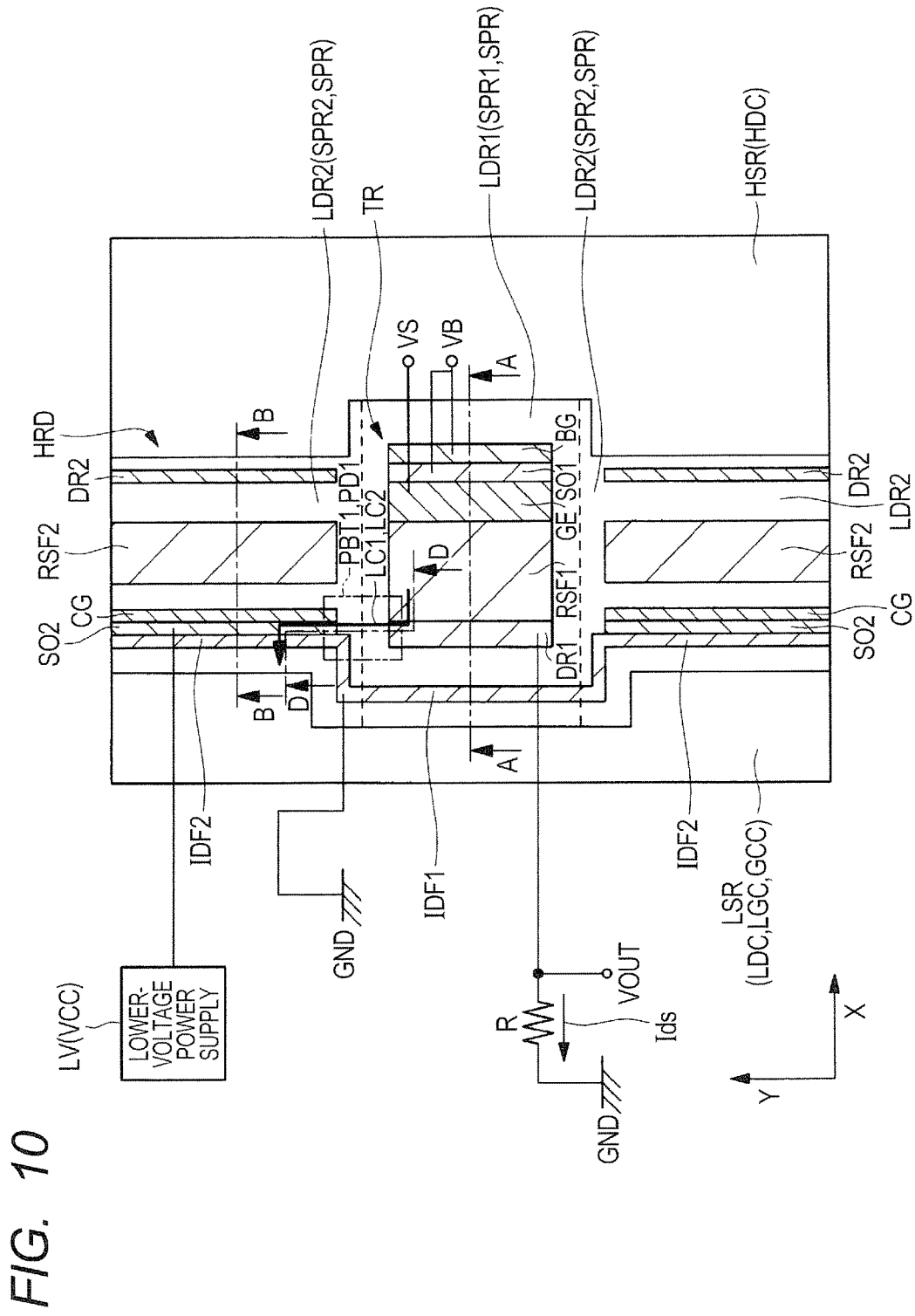
FIG. 10 is a main-portion plan view of the semiconductor device in the comparative example.
Figure 11:
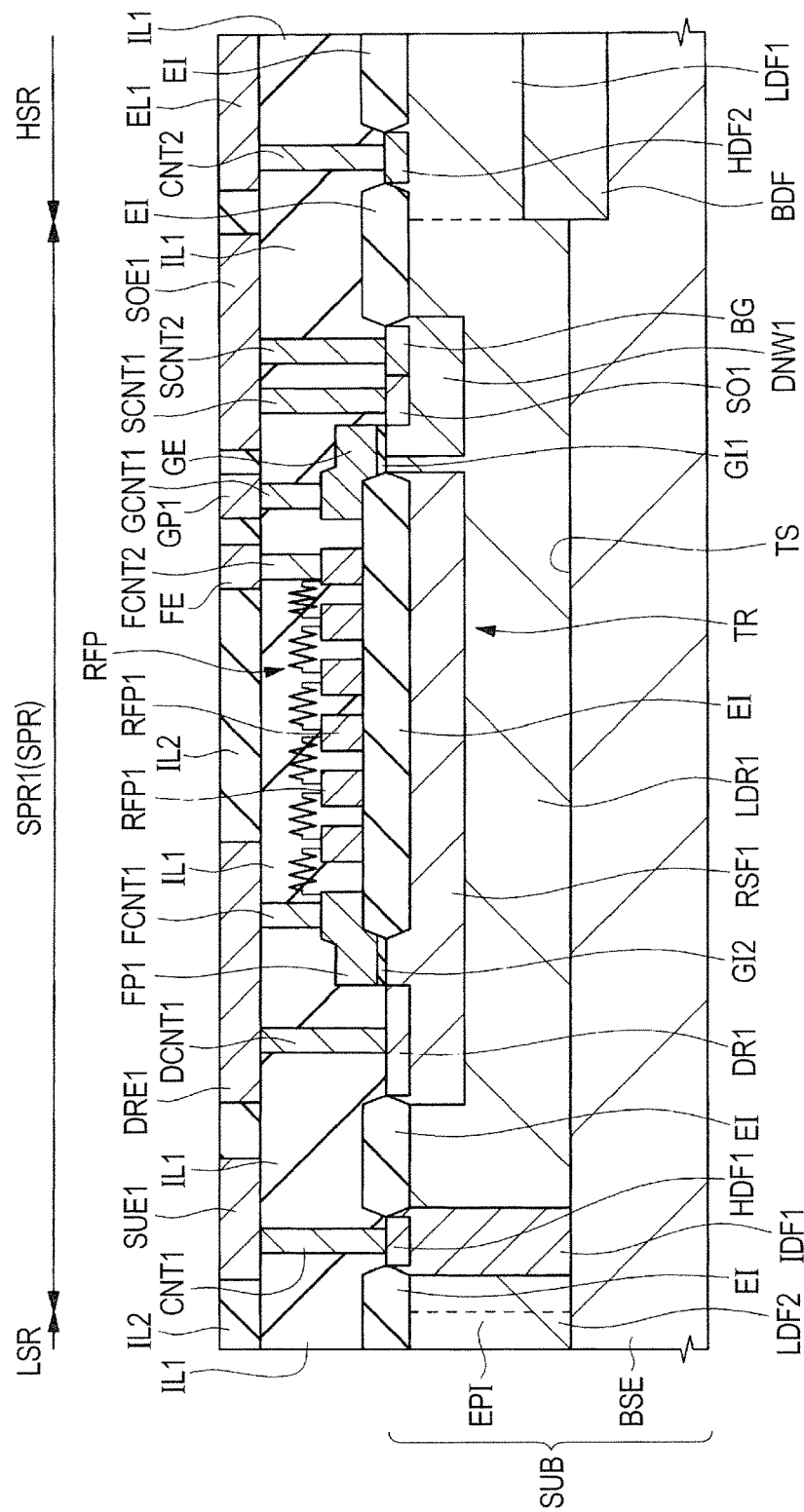
FIG. 11 is a main-portion cross-sectional view of the semiconductor device in the comparative example.
Figure 12:
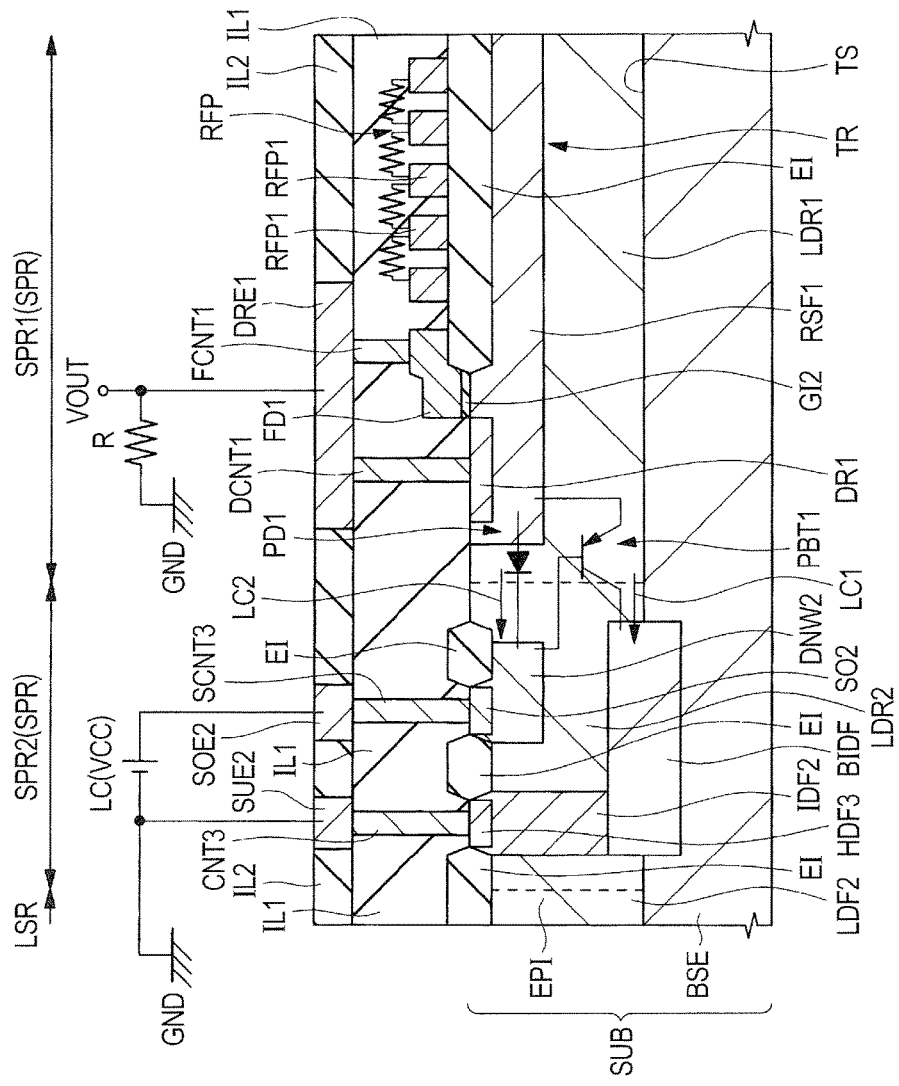
FIG. 12 is a main-portion cross-sectional view of the semiconductor device in the comparative example.

Next, a description will be given of a semiconductor device in a comparative example. FIGS. 9 and 10 are main-portion plan views of the semiconductor device in the comparative example. FIGS. 11 and 12 are main-portion cross-sectional views of the semiconductor device in the comparative example.

FIG. 9 shows the periphery of the coupling transistor TR. FIG. 10 shows the periphery of the coupling transistor TR in enlarged relation. In each of FIGS. 9 and 10, the state of electrical coupling of the coupling transistor TR is schematically shown in conjunction with the plan view. FIG. 11 is a cross-sectional view along the line A-A in FIGS. 9 and 10. FIG. 12 is a cross-sectional view along the line D-D in FIG. 10. In FIG. 12, the state of electrical coupling is schematically shown in conjunction with the cross-sectional view.

The semiconductor device in the comparative example is different from the semiconductor device in Embodiment 1 in that the coupling transistor TR is not surrounded by the p-type semiconductor region IDF1. The semiconductor device in the comparative example is otherwise the same as the semiconductor device in Embodiment 1.

In the semiconductor device in the comparative example also, in the same manner as in the semiconductor device in Embodiment 1, the n⁻-type semiconductor region LDR1 includes the portion of the n⁻-type semiconductor layer EPI which is located in the region SPR1 of the isolation region SPR where the coupling transistor TR is formed.

However, in the semiconductor device in the comparative example, unlike in the semiconductor device in Embodiment 1, the source region SO1, the resurf layer RSF1, and the drain region DR1 are not surrounded by the p-type semiconductor region IDF1. That is, the coupling transistor TR is not surrounded by the p-type semiconductor region IDF1. Thus, the region SPR1 of the isolation region SPR is the region where the coupling transistor TR is formed, but is not the region surrounded by the p-type semiconductor region IDF1. Note that, in the portion of the n⁻-type semiconductor region LDR2 which is opposite to the control gate electrode CG relative to the source region SO2 interposed therebetween, the p-type semiconductor region IDF1 is formed.

In the semiconductor device in the comparative example also, in the same manner as in the semiconductor device in Embodiment 1, the rectifying element HRD is formed in the region SPR2 of the isolation region SPR.

As shown in FIG. 12, in the semiconductor device in the comparative example, a parasitic bipolar transistor PBT1 is formed. The parasitic bipolar transistor PBT1 is a pnp bipolar transistor. The parasitic bipolar transistor PBT1 has the p-type semiconductor regions IDF2 and BIDF as a collector, has the n⁻-type semiconductor regions LDR1 and LDR2 and the n-type semiconductor region DNW2 and the source region SO2 of the rectifying element HRD as a base, and has the drain region DR1 and the resurf layer RSF1 of the coupling transistor TR as an emitter.

Also, in the semiconductor device in the comparative example, a parasitic diode PD1 is formed. The parasitic diode PD1 has the drain region DR1 and the resurf layer RSF1 of the coupling transistor TR as an anode and has the n⁻-type semiconductor regions LDR1 and LDR2 and the n-type semiconductor region DNW2 and the source region SO2 of the rectifying element HRD as a cathode.

A consideration will be given of the case where, as described above, the power supply potential VB (when charges are stored in the capacitive element BSC) is applied to the source region SO1 of the coupling transistor TR and the coupling transistor TR is brought into the ON state. The potential in each of the drain region DR1 and the resurf layer RSF1 at this time is a potential (e.g., 20 V) equal to the output potential VOUT. On the other hand, to the source region SO2 of the rectifying element HRD, the power supply potential (e.g., 15 V) lower than the potential in each of the drain region DR1 and the resurf layer RSF1 when the coupling transistor TR is in the ON state is supplied. As a result, the parasitic bipolar transistor RBT1 is operated and a leakage current LC1 flows. Otherwise, the parasitic diode PD1 is operated and a leakage current LC2 flows.

Briefly, the semiconductor device in the comparative example has the parasitic bipolar transistor PBT1 or the parasitic diode PD1 formed extensively over the regions SPR1 and SPR2. Accordingly, in the semiconductor device in the comparative example, the leakage current LC1 or LC2 flows through the parasitic bipolar transistor PBT1 or the parasitic diode PD1 formed extensively from the region SPR1 to the region SPR2.

That is, in the semiconductor device in the comparative example, the parasitic bipolar transistor or the parasitic diode formed between the semiconductor element and the coupling transistor made of the p-channel MOSFET, which are embedded in mixed relation, may be operated and a leakage current may flow through the parasitic bipolar transistor or the parasitic diode to degrade the performance of the semiconductor device.

<Main Characteristic Features and Effects of Embodiment 1>

In the semiconductor device in Embodiment 1, the source region SO1, the resurf layer RSF1, and the drain region DR1 are surrounded by the p-type semiconductor region IDF1. Consequently, the coupling transistor TR is surrounded by the p-type semiconductor region IDF1. In addition, the region SPR1 includes the area surrounded by the p-type semiconductor region IDF1 and the area where the p-type semiconductor region IDF1 is formed.

In the semiconductor device in Embodiment 1, unlike in the semiconductor device in the comparative example, the n⁻-type semiconductor region LDR1 as the portion of the base of the parasitic bipolar transistor PBT1 (see FIG. 8) which is located in the region SPR1 is isolated from the n⁻-type semiconductor region LDR2, the n-type semiconductor region DNW2, and the source region SO2 each as the portion of the base of the parasitic bipolar transistor PBT1 which is located in the region SPR2 by the p-type semiconductor region IDF1. Accordingly, in the semiconductor device in Embodiment 1, unlike in the semiconductor device in the comparative example, even when the power supply potential VCC lower than the potential in each of the drain region DR1 and the resurf layer RSF1 when the coupling transistor TR is in the ON state is supplied to the source region SO2 of the rectifying element HRD, the parasitic bipolar transistor RBT1 is less likely to be operated.

Also, in the semiconductor device in Embodiment 1, unlike in the semiconductor device in the comparative example, the n⁻-type semiconductor region LDR1 as the portion of the parasitic diode PD1 (see FIG. 8) which is located in the region SPR1 is isolated from the n⁻-type semiconductor region LDR2, the n-type semiconductor region DNW2, and the source region SO2 each as the portion of the parasitic diode PD1 which is located in the region SPR2 are isolated by the p-type semiconductor region IDF1. Accordingly, in the semiconductor device in Embodiment 1, unlike in the semiconductor device in the comparative example, even when the power supply potential VCC lower than the potential in each of the drain region DR1 and the resurf layer RSF1 when the coupling transistor TR is in the ON state is supplied to the source region SO2 of the rectifying element HRD, the parasitic diode PD1 is less likely to be operated.

Therefore, in the semiconductor device in Embodiment 1, it is possible to more reliably prevent or inhibit the leakage currents LC1 and LC2 (see FIG. 8) from flowing through the parasitic bipolar transistor PBT1 or the parasitic diode PD1 formed extensively from the region SPR1 to the region SPR2 than in the semiconductor device in the comparative example. This allows the coupling transistor TR made of the p-channel MOSFET as the level-down shifter and a semiconductor element such as, e.g., the rectifying element HRD to be mounted in proximate and mixed relation.

That is, according to Embodiment 1, even when the coupling transistor TR made of the p-channel MOSFET as the level-down shifter and a semiconductor element such as, e.g., the rectifying element HRD are mounted in proximate and mixed relation, the performance of the semiconductor device can be improved.

Figure 13:
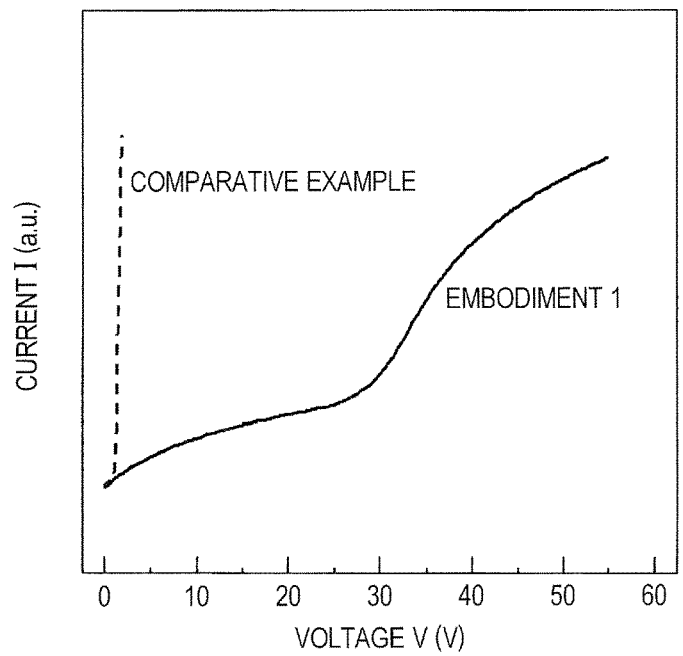
FIG. 13 is a graph showing the voltage dependence of a leakage current flowing in a parasitic bipolar transistor.

FIG. 13 is a graph showing the voltage dependence of a leakage current flowing in the parasitic bipolar transistor. FIG. 13 shows the relationship between a voltage V between the drain region DR1 of the coupling transistor TR and the lower-voltage power supply LD and a current I flowing between the drain region DR1 of the coupling transistor TR and the lower-voltage power supply LV when the coupling transistor TR is in the ON state.

As shown in FIGS. 7 to 10, the source region SO2 of the rectifying element HRD is electrically coupled to the lower-voltage power supply LV having the power supply potential VCC. Accordingly, FIG. 13 shows the relationship between the voltage V between the drain region DR1 and the source region SO2 and the current I flowing between the drain region DR1 and the source region SO2 when the coupling transistor TR is in the ON state in each of the comparative example and Embodiment 1. The current I flowing between the drain region DR1 and the source region SO2 is a current flowing in the parasitic diode PD1 and is also a base current flowing between the emitter and the base of the parasitic bipolar transistor PBT1.

As shown in FIG. 13, in the semiconductor device in the comparative example, even when the voltage V is in the vicinity of 0 V, the current I rapidly increases with the increase of the voltage V. This means that, in the semiconductor device in the comparative example, the parasitic bipolar transistor PBT1 or the parasitic diode PD1 is operated to allow the leakage current to flow.

On the other hand, in the semiconductor device in Embodiment 1, when the voltage V is in a range of not less than about 30 V, the current I increases with the increase of the voltage V. However, when the voltage V is in a range of less than about 30 V, the current I scarcely increases with the increase of the voltage V. This means that, as described above, in the semiconductor device in Embodiment 1, the parasitic bipolar transistor PBT1 or the parasitic diode PD1 formed extensively from the region SPR1 to the region SPR2 is not operated.

Preferably, the p-type semiconductor region IDF1 includes a portion PT1 located on one side of the resurf layer RSF1 and the drain region DR1 in the Y-axis direction in plan view (on the upper side in FIG. 8). The p-type semiconductor region IDF1 also includes a portion PT2 located on the side of the resurf layer RSF1 and the drain region DR1 which is opposite to one side thereof in the X-axis direction in plan view (on the left side in FIG. 8). The p-type semiconductor region IDF1 also includes a portion PT3 located on the side of the resurf layer RSF1 and the drain region DR1 which is opposite to the one side thereof in the Y-axis direction in plan view (on the lower side in FIG. 8). Of the p-type semiconductor region IDF1, the portions PT1, PT2, and PT3 are integrally formed.

As described above, in the region SPR2, the p-type semiconductor region IDF2 as the collector of the parasitic bipolar transistor PBT1 is formed in the portion of the n$^-$-type semiconductor region LDR2 which is located closer to the control gate electrode CG than the lower-voltage circuit region LSR (on the left side in FIG. 8). Consequently, current paths in the parasitic bipolar transistor PBT1 or the parasitic diode PD1 are locally located mainly on one side of the coupling transistor TR in the Y-axis direction (on the upper side in FIG. 8), on the side of the coupling transistor TR which is opposite to one side thereof in the X-axis direction (on the left side in FIG. 8), and on the side of the coupling transistor TR which is opposite to the one side thereof in the Y-axis direction (on the lower side in FIG. 8). Accordingly, when, e.g., the potential in the n$^-$-type semiconductor region LDR1 is equal to the potential in the n$^-$-type semiconductor region LDF1, it may also be possible that a portion PT4 of the p-type semiconductor region IDF1 which is located on the one side in the X-axis direction (on the right side in FIG. 8) is not formed and the portions PT1, PT2, and PT3 are integrally formed. In such a case also, it is possible to reliably prevent or inhibit the leakage current LC1 or LC2 from flowing through the parasitic bipolar transistor PBT1 or the parasitic diode PD1 formed extensively from the region SPR1 to the region SPR2.

More preferably, the p-type semiconductor region IDF1 includes the portion PT4 located on the one side in the X-axis direction in plan view (on the right side in FIG. 8). Of the p-type semiconductor region IDF1, the portions PT1, PT2, PT3, and PT4 are integrally formed. In such a case, it is possible to more reliably prevent or inhibit the leakage current LC1 or LC2 from flowing through the parasitic bipolar transistor PBT1 or the parasitic diode PD1 formed extensively from the region SPR1 to the region SPR2.

Note that, at this time, each of the source region SO2, the control gate electrode CG, the resurf layer RSF2, and the drain region DR2 of the rectifying element HRD is formed in the portion of the n$^-$-type semiconductor region LDR2 which is located on, e.g., one side of the portion PT1 in the Y-axis direction (on the upper side in FIG. 8) to be apart from the portion PT1. Also, the p-type semiconductor region IDF2 is formed in the portion of the n$^-$-type semiconductor region LDR2 which is located on, e.g., one side of the portion PT1 in the Y-axis direction in the region SPR2 (on the upper side in FIG. 8) to be in contact with the base BSE.

Preferably, the p-type semiconductor region IDF1 is in contact with the base BSE. In such a case also, it is possible to reliably prevent or inhibit the leakage current LC1 or LC2 from flowing through the parasitic bipolar transistor RBT1 or the parasitic diode PD1 formed extensively from the region SPR1 to the region SPR2.

Note that, in a most preferable case, the whole p-type semiconductor region IDF1 is integrally formed and the integrally formed p-type semiconductor region IDF1 surrounds the entire periphery of the coupling transistor TR and has the entire periphery thereof in contact with the base BSE. In such a case, it is possible to completely prevent a leakage current from flowing through the parasitic bipolar transistor RBT1 or the parasitic diode PD1 formed extensively from the region SPR1 to the region SPR2.

Note that, as shown in FIG. 8, in the semiconductor device in Embodiment 1, a parasitic bipolar transistor PBT2 is formed. The parasitic bipolar transistor PBT2 is a pnp bipolar transistor. The parasitic bipolar transistor PBT2 has the p-type semiconductor region IDF1 as the collector, has the n$^-$-type semiconductor region LDR1 as the base, and has the drain region DR1 and the resurf layer RSF1 of the coupling transistor TR as the emitter.

Preferably, the back gate BG is electrically coupled to the source region SO1 via the source electrode SOE1 as the wiring. This allows the potential supplied to the drain region DR1 and the resurf layer RSF1 as the emitter to be equal to the potential supplied to the n$^-$-type semiconductor region LDR1 as the base in the parasitic bipolar transistor PBT2. This can prevent the parasitic bipolar transistor PBT2 from being operated. Therefore, it is possible to prevent a leakage current LC3 from flowing through the parasitic bipolar transistor PBT2.

Also, as shown in FIG. 8, in the semiconductor device in Embodiment 1, a parasitic bipolar transistor PBT3 is formed. The parasitic bipolar transistor PBT3 is an npn bipolar transistor. The parasitic bipolar transistor PBT3 has the n⁻-type semiconductor region LDR1 as the collector, has the p-type semiconductor region IDF1 as the base, and has the n⁻-type semiconductor region LDR2 and the n-type semiconductor region DNW2 and the source region SO2 of the rectifying element HRD as the emitter.

However, in the semiconductor device in Embodiment 1, to the n⁻-type semiconductor region LDR2 and the n-type semiconductor region DNW2 and the source region SO2 of the rectifying element HRD as the emitter, the power supply potential VCC is supplied and, to the p-type semiconductor region IDF1 as the base, 0 V as a potential lower than the potential supplied to the emitter, i.e., the ground potential is supplied. Accordingly, the parasitic bipolar transistor PBT3 is not operated. Therefore, it is possible to prevent or inhibit a leakage current LC4 from flowing through the parasitic bipolar transistor PBT3.

Figure 14:
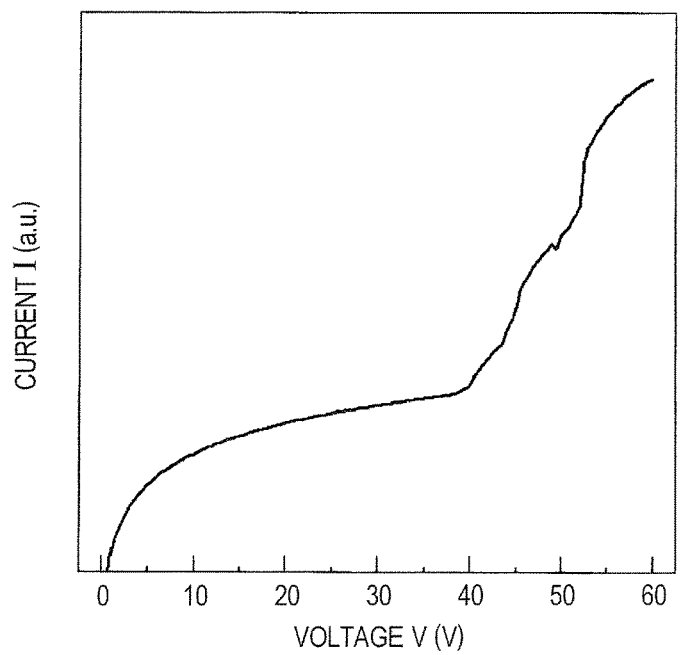
FIG. 14 is a graph showing the voltage dependence of a leakage current flowing in a parasitic bipolar transistor.

FIG. 14 is a graph showing the voltage dependence of a leakage current flowing in a parasitic bipolar transistor. FIG. 14 shows the relationship between the voltage V between the source region SO1 of the coupling transistor TR and the lower-voltage power supply LV and the current I flowing between the source region SO1 of the coupling transistor TR and the lower voltage power supply LV in Embodiment 1.

As shown in FIGS. 7 to 10, the source region SO2 of the rectifying element HRD is electrically coupled to the lower-voltage power supply LV having the power supply potential VCC. Also, as described above, the source region SO1 is electrically coupled to the back gate BG of the coupling transistor TR via the source electrode SOE1 as the wiring. Accordingly, FIG. 13 shows the relationship between the voltage V between the source regions SO1 and SO2 and the current I flowing between the source regions SO1 and SO2 when the coupling transistor TR is in the ON state. The current I flowing between the source regions SO1 and SO2 is a collector current flowing between the collector and the emitter of the parasitic bipolar transistor PBT3.

As shown in FIG. 14, in the parasitic bipolar transistor PBT3, when the voltage V is in a range of not less than about 40 V, the current I increases with the increase of the voltage V. However, when the voltage V is in a range of less than about 40 V, the current I scarcely increases with the increase of the voltage V. This means that, in the semiconductor device in Embodiment 1, when the voltage V is in a range of less than about 40 V, the parasitic bipolar transistor PBT3 is not operated and the leakage current LC4 does not flow.

Figure 15:
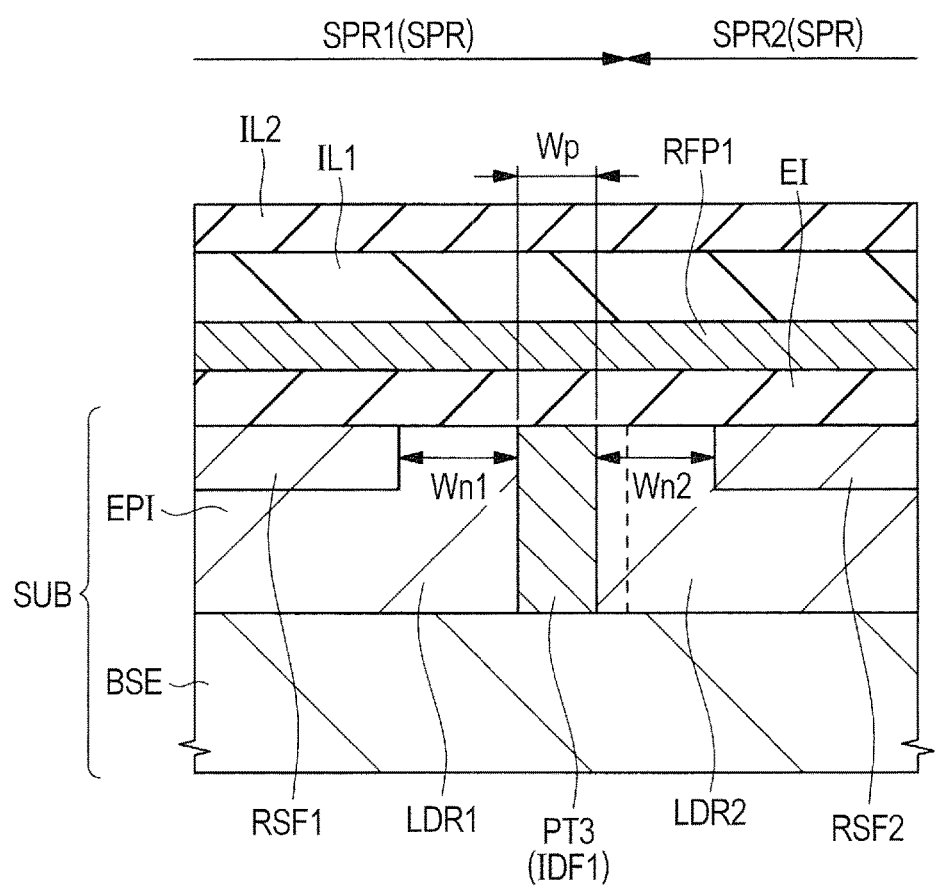
FIG. 15 is a main-portion cross-sectional view of the semiconductor device in Embodiment 1.

FIG. 15 is a main-portion cross-sectional view of the semiconductor device in Embodiment 1. FIG. 15 is a cross-sectional view along the line C-C in FIG. 8.

As described above, the p-type semiconductor region IDF1 is apart from the resurf layer RSF1 in plan view. That is, of the p-type semiconductor region IDF1, the portions PT1, PT2, PT3, and PT4 are apart from the resurf layer RSF1 formed in the region SPR1 in plan view. The portions PT1, PT2, PT3, and PT4 of the p-type semiconductor region IDF1 are also apart from the resurf layer RSF2 formed in the region SPR2 in plan view.

That is, as shown in FIG. 15, the portion PT3 is apart from each of the resurf layer RSF1 formed in the region SPR1 and the resurf layer RSF2 formed in the region SPR2. It is assumed herein that the distance between the resurf layer RSF1 and the portion PT3 in the Y-axis direction (see FIG. 8), i.e., the width of the portion of the n⁻-type semiconductor region LDR1 which is interposed between the resurf layer RSF1 and the portion PT3 in the Y-axis direction (see FIG. 8) is a width Wn1. It is also assumed that the width of the portion PT3 in the Y-axis direction is a width Wp.

In the case where 0 V is supplied to the p-type semiconductor region IDF1, even when the potential supplied to the source region SO1 is sufficiently lower than the power supply potential VT, it is preferable to sufficiently reduce the widths Wn1 and Wp so as to sufficiently deplete each of the n⁻-type semiconductor region LDR1 between the resurf layer RSF1 and the p-type semiconductor region IDF1 and the p-type semiconductor region IDF1. This allows semiconductor elements such as the coupling transistor TR formed in the region SPR1 and the rectifying element HRD formed in the region SPR2 to be reliably electrically isolated from each other. Specifically, each of the widths Wn1 and Wp can be reduced to, e.g., about 3 to 10 μm.

On the other hand, it is assumed that the width of the portion of the n⁻-type semiconductor layer EPI which is located between the resurf layer RSF2 and the portion PT3 in the Y-axis direction (see FIG. 8) is a width Wn2. In the case where 0 V is supplied to the p-type semiconductor region IDF1, even when the potential supplied to the source region SO1 is sufficiently lower than the power supply potential VT, it is preferable to sufficiently reduce the widths Wn2 and Wp so as to sufficiently deplete each of the n⁻-type semiconductor layer EPI between the resurf layer RSF2 and the p-type semiconductor region IDF1 and the p-type semiconductor region IDF1. This allows semiconductor elements such as the coupling transistor TR formed in the region SPR1 and the rectifying element HRD formed in the region SPR2 to be reliably electrically isolated from each other. Specifically, each of the widths Wn2 and Wp can be reduced to, e.g., about 3 to 10 μm.

<Modification of Semiconductor Device in Embodiment 1>

Figure 16:
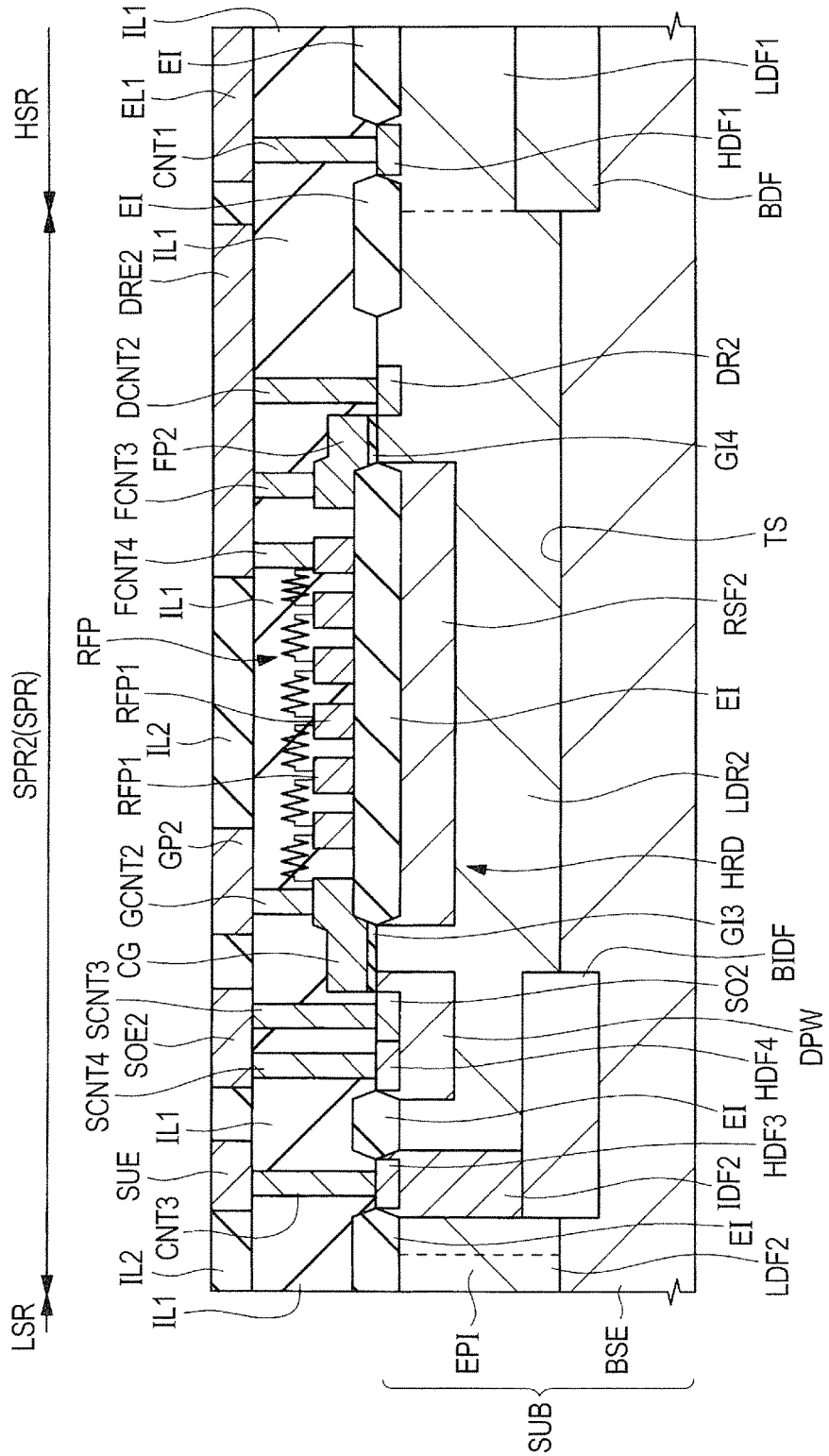
FIG. 16 is a cross-sectional view of a modification of the semiconductor device in Embodiment 1.

Next, a description will be given of a modification of the semiconductor device in Embodiment 1. FIG. 16 is a cross-sectional view of the modification of the semiconductor device in Embodiment 1. Note that FIG. 16 is a cross-sectional view equivalent to the cross-sectional view of FIG. 5 in Embodiment 1.

The semiconductor device in the present modification is different from the semiconductor device in Embodiment 1 in that the rectifying element HRD has an n-channel MOSFET which is not a complete-depletion-type MOSFET, instead of the n-channel complete-depletion-type MOSFET, and a diode. The semiconductor device in the present modification can be otherwise the same as the semiconductor device in Embodiment 1 so that a description thereof is omitted.

Similarly to the rectifying element HRD in Embodiment 1, the rectifying element HRD in the present modification has the n⁻-type semiconductor region LDR2, the control gate electrode CG, the source region OS2 as an n⁺-type semiconductor region, the drain region DR2 as an n⁺-type semiconductor region, and the resurf layer RSF2 as the p-type semiconductor region On the other hand, unlike the rectifying element HRD in Embodiment 1, the rectifying element HRD in the present modification has a p⁺-type semiconductor region HDF4 and a p-type semiconductor region DPW. A p-type impurity concentration in the p⁺-type semiconductor region HDF4 is higher than a p-type impurity concentration in the p-type semiconductor region DPW.

The p-type semiconductor region DPW is formed in the upper-layer portion of the part of the n⁻-type semiconductor region LDR2 which is located under the portion of the control gate electrode CG which is closer to the lower-voltage circuit region SLR and in the upper-layer portion of the part of the n⁻-type semiconductor region LDR2 which is located closer to the lower-voltage circuit region LSR than the control gate electrode CG. The source region SO2 is formed in the upper-layer portion of the part of the p-type semiconductor region DPW which is located closer to the control gate electrode CG. The p⁺-type semiconductor region HDF4 is formed in the upper-layer portion of the part of the p-type semiconductor region DPW which is opposite to the control gate electrode CG relative to the source region SO2 interposed therebetween. The source region SOE2 is electrically coupled to the p⁺-type semiconductor region HDF4 via a contact SCNT4 as a coupling electrode extending through the interlayer insulating film.

The n⁻-type semiconductor region LDR2, the control gate electrode CG, the source region SO2, the p-type semiconductor region DPW, and the drain region DR2 form the n-channel MISFET. On the other hand, the p⁺-type semiconductor region HDF4, the p-type semiconductor region DPW, the n⁻-type semiconductor region LDR2, and the drain region DR2 form a diode.

The p⁺-type semiconductor region HDF4 is electrically coupled to the source region SO2 via the contact SCNT4, the source electrode SOE2, and the contact SCNT3. Accordingly, in the present modification, the rectifying element HRD has the re-channel MOSFET and the diode which are coupled in parallel to each other.

In the semiconductor device in the present modification also, in the same manner as in the semiconductor device in the comparative example, the parasitic bipolar transistor PBT1 (see FIG. 8) is formed. The parasitic bipolar transistor PBT1 is a pnp bipolar transistor. The parasitic bipolar transistor PBT1 has the p-type semiconductor regions IDF2 and BIDF as the collector, has the n⁻-type semiconductor regions LDR1 and LDR2 and the source region SO2 of the rectifying element HRD as the base, and has the drain region DR1 and the resurf layer RSF1 of the coupling transistor TR as the emitter. Accordingly, in the case where the coupling transistor TR is not surrounded by the p-type semiconductor region IDF1, the parasitic bipolar transistor PBT1 is operated so that the leakage current LC1 (see FIG. 8) flows.

However, in the semiconductor device in the present modification also, in the same manner as in the semiconductor device in Embodiment 1, the coupling transistor TR is surrounded by the p-type semiconductor region IDF1. Consequently, in the semiconductor device in the present modification also, the n⁻-type semiconductor region LDR1 as the portion of the base of the parasitic bipolar transistor PBT1 (see FIG. 8) which is located in the region SPR1 and the n⁻-type semiconductor region LDR2 and the source region SO2 each as the portion of the base of the parasitic bipolar transistor PBT1 (see FIG. 8) which is located in the region SPR2 are isolated from each other by the p-type semiconductor region IDF1. Accordingly, in the semiconductor device in the present modification also, in the same manner as in the semiconductor device in Embodiment 1, the parasitic bipolar transistor PBT1 is less likely to be operated.

As a result, in the semiconductor device in the present modification also, in the same manner as in the semiconductor device in Embodiment 1, it is possible to more reliably prevent or inhibit the leakage current LC1 (see FIG. 8) from flowing through the parasitic bipolar transistor PBT1 formed extensively from the region SPR1 to the region SPR2 than in the semiconductor device in the comparative example.

<Method of Manufacturing Semiconductor Device in Embodiment 1>

Next, a description will be given of a method of manufacturing the semiconductor device in Embodiment 1. FIGS. 17 to 21 are main-portion cross-sectional views of the semiconductor device in Embodiment 1 during the manufacturing process thereof. Note that FIGS. 17 to 21 are cross-sectional views equivalent to the cross-sectional view of FIG. 4.

Figure 17:
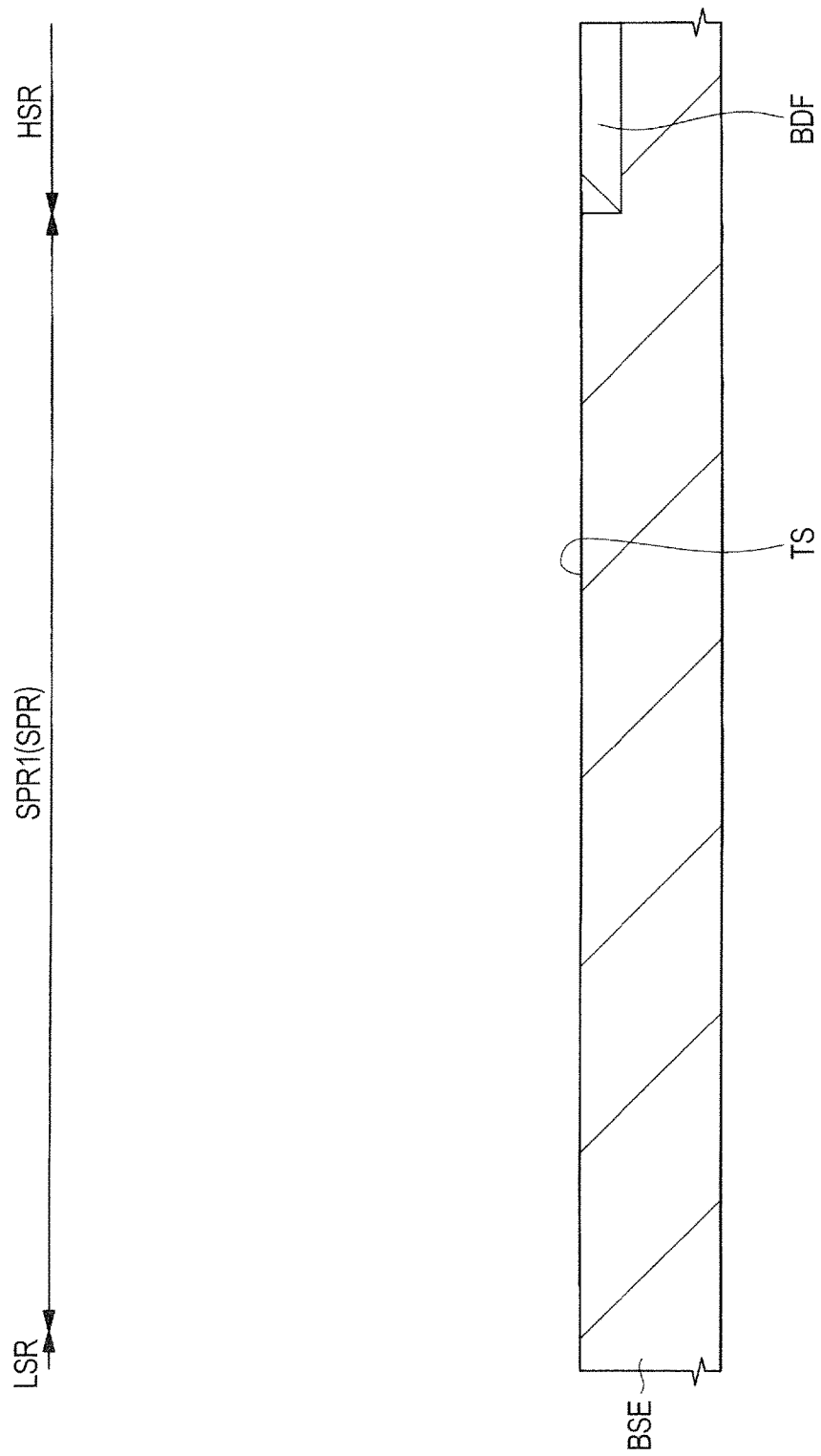
FIG. 17 is a main-portion cross-sectional view of the semiconductor device in Embodiment 1 during a manufacturing process thereof.

First, as shown in FIG. 17, the base BSE as a semiconductor substrate is provided. The base BSE has, as partial regions of the upper surface TS as the main surface of the base BSE, the higher-voltage circuit region HSR, the isolation region SPR, and the lower-voltage circuit region LSR. The base BSE is made of, e.g., a silicon (Si) monocrystalline substrate. Note that FIG. 17 shows a cross section in the region SPR1 of the isolation region SPR where the coupling transistor TR (see FIG. 21) is to be formed.

Next, as shown in FIG. 17, over the upper surface TS as the main surface of the base BSE, a resist pattern (the illustration thereof is omitted) is formed and, using the formed resist pattern as a mask, an n-type impurity is implanted into the base BSE by an ion implantation method. After the resist pattern is removed, the base BSE is subjected to heat treatment. Thus, in the higher-voltage circuit region HSR, the embedded diffusion layer BDF as an n-type semiconductor region is formed in the upper-layer portion of the base BSE.

Figure 18:
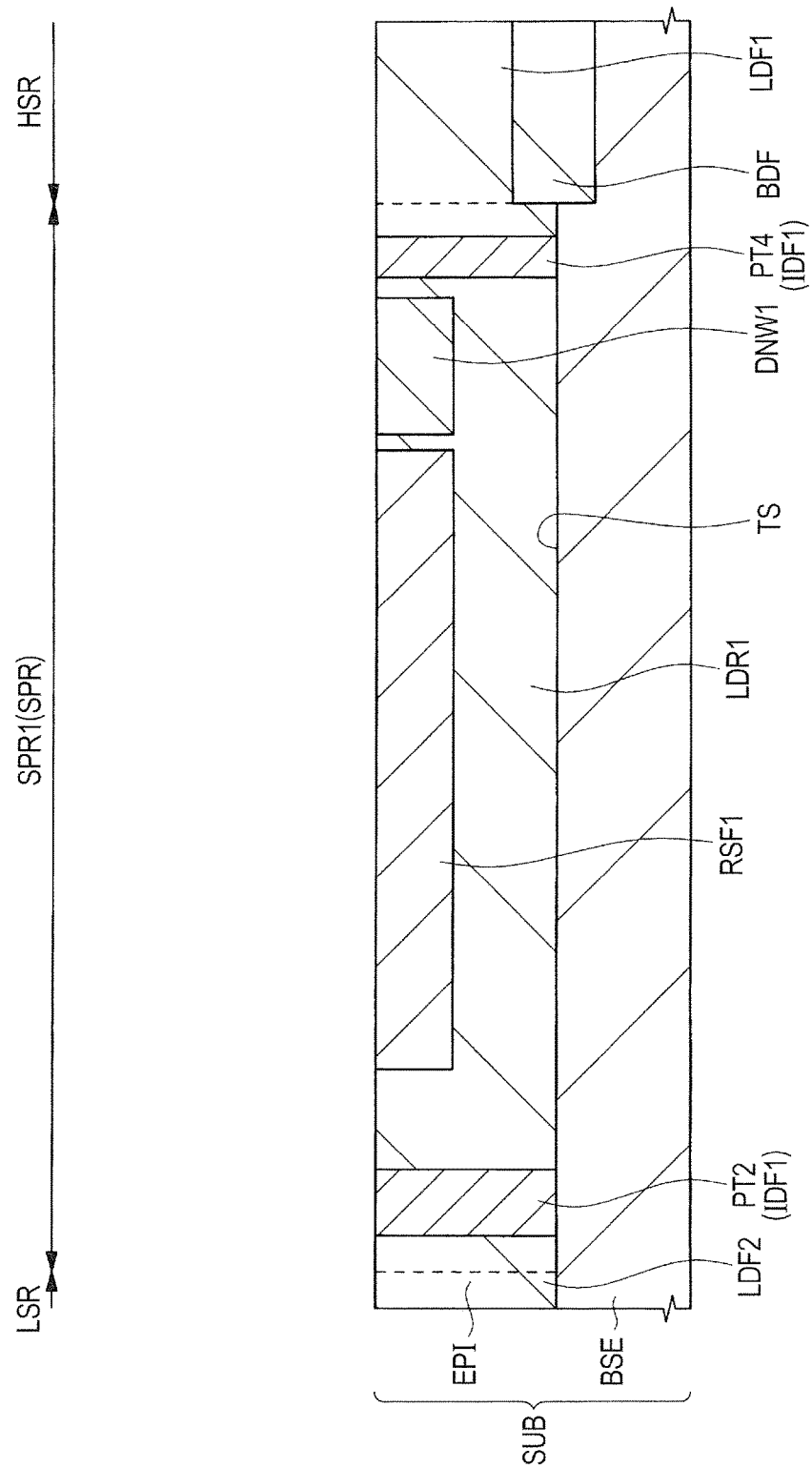
FIG. 18 is a main-portion cross-sectional view of the semiconductor device in Embodiment 1 during the manufacturing process thereof.

Next, as shown in FIG. 18, over the base BSE, the n⁻-type semiconductor layer EPI is epitaxially grown. Thus, the substrate SUB including the base BSE as a p-type semiconductor substrate and the n⁻-type semiconductor layer EPI formed over the base BSE is formed. At this time, the n⁻-type semiconductor region LDR1 including the portion of the n⁻-type semiconductor layer EPI which is located in the region SPR1 of the isolation region SPR where the coupling transistor TR (see FIG. 21) is to be formed is formed. Also, the n⁻-type semiconductor region LDF1 including the portion of the n⁻-type semiconductor layer EPI which is located in the higher-voltage circuit region HSR is formed and the n⁻-type semiconductor region LDF2 including the portion of the n⁻-type semiconductor layer EPI which is located in the lower-voltage circuit region LSR is formed.

Next, as shown in FIG. 18, over the substrate SUB, a resist pattern (the illustration thereof is omitted) is formed and, using the formed resist pattern as a mask, a p-type impurity is implanted into the substrate SUB by an ion implantation method and then the resist pattern is removed. Thus, in the region SPR1 of the isolation region SPR, the p-type semiconductor region IDF1 is formed in the n⁻-type semiconductor region LDR1. Preferably, the p-type semiconductor region IDF1 is in contact with the base BSE. Note that FIG. 18 shows the portions PT2 and PT4 of the p-type semiconductor region IDF1.

Next, as shown in FIG. 18, over the substrate SUB, a resist pattern (the illustration thereof is omitted) is formed and, using the formed resist pattern as a mask, a p-type impurity is implanted into the substrate SUB by an ion implantation method and then the resist pattern is removed. Thus, in the region SPR1 of the isolation region SPR, in the upper-layer portion of the n⁻-type semiconductor region LDR1, the resurf layer RSF1 as the p-type semiconductor region is formed.

Next, as shown in FIG. 18, over the substrate SUB, a resist pattern (the illustration thereof is omitted) is formed and, using the formed resist pattern as a mask, an n-type impurity is implanted into the semiconductor substrate SUB by an ion implantation method. Then, the resist pattern is removed. Thus, in the region SPR1 of the isolation region SPR, in the upper-layer portion of the n⁻-type semiconductor region LDR1, the n-type semiconductor region DNW1 is formed.

At this time, the substrate SUB is subjected to heat treatment so that the n-type impurity introduced into the embedded diffusion layer BDF is diffused. As a result, in the higher-voltage circuit region HSR, the embedded diffusion layer BDF is formed also in the lower-layer portion of the n⁻-type semiconductor region LDF1.

Figure 19:
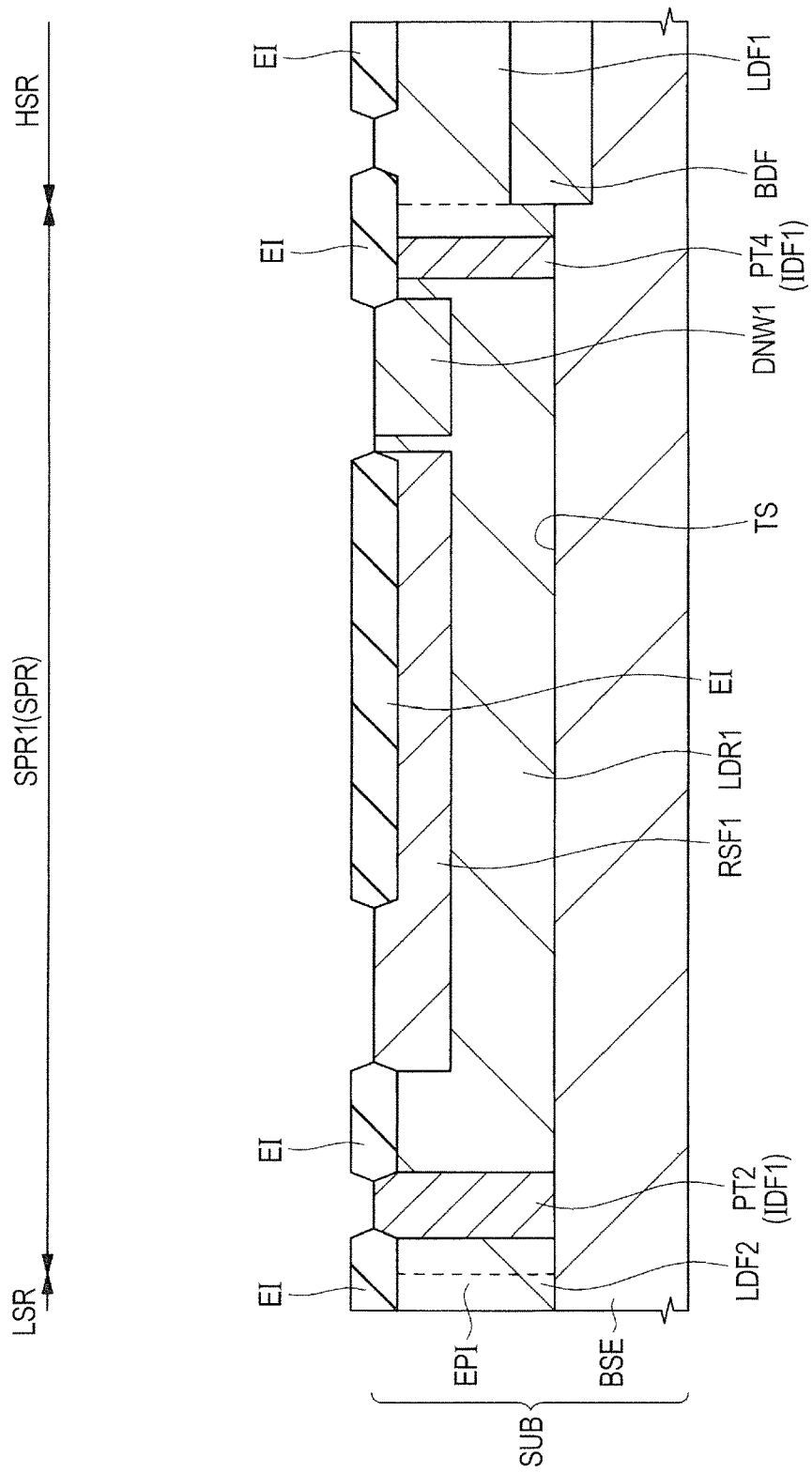
FIG. 19 is a main-portion cross-sectional view of the semiconductor device in Embodiment 1 during the manufacturing process thereof.

Next, as shown in FIG. 19, over the substrate SUB, the isolation film EI is formed by, e.g., a LOCOS method. The isolation film EI is made of, e.g., a silicon dioxide ($SiO_2$) film. At this time, in the region SPR1 of the isolation region SPR, the isolation film EI is formed over the resurf layer RSF1, over the n⁻-type semiconductor region LDR1, and over the p-type semiconductor region IDF1. On the other hand, in the higher-voltage circuit region HSR and the lower-voltage circuit region LSR, the isolation film EI is formed over the n⁻-type semiconductor regions LDF1 and LDF2.

Figure 20:
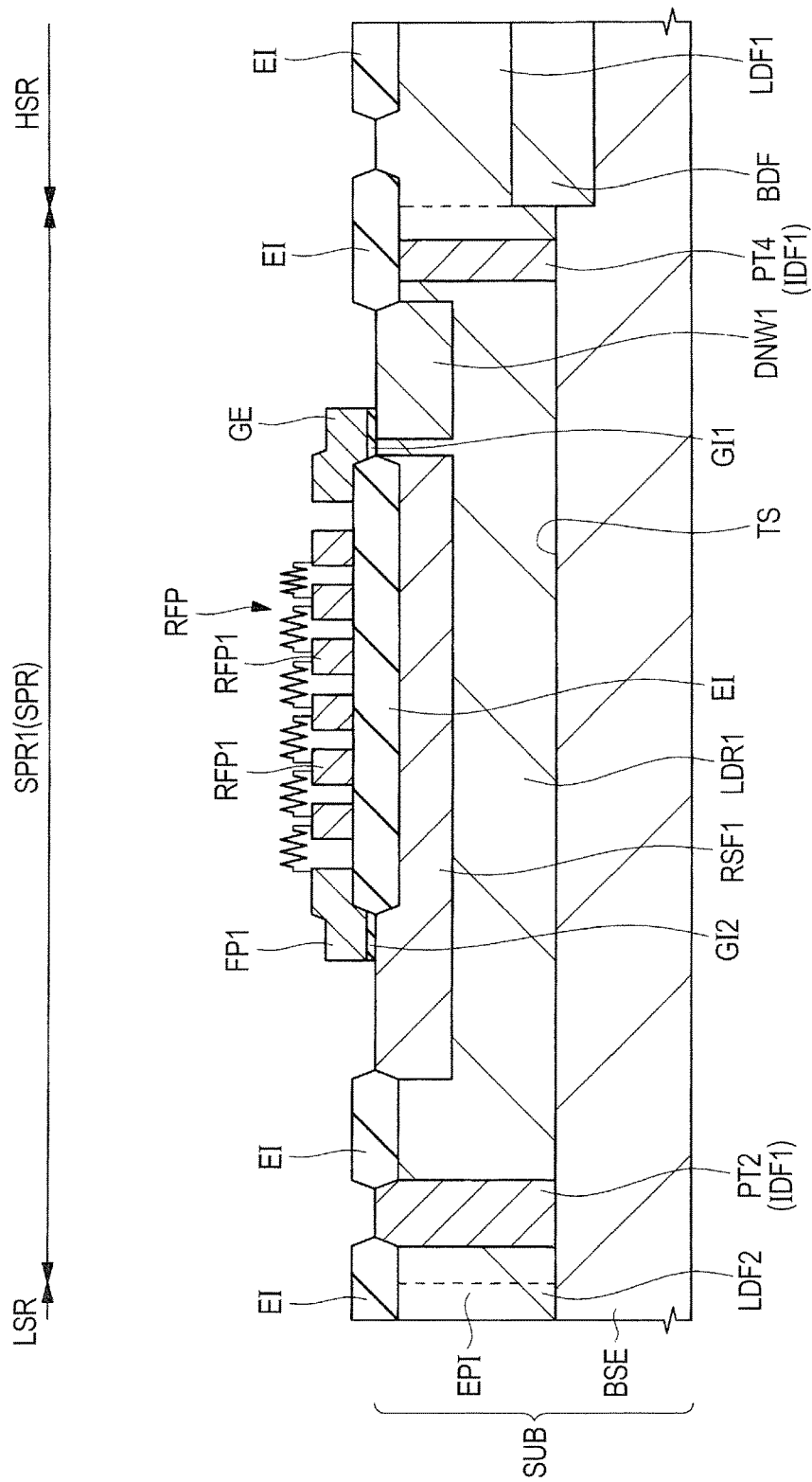
FIG. 20 is a main-portion cross-sectional view of the semiconductor device in Embodiment 1 during the manufacturing process thereof.

Next, the upper surface of the substrate SUB is thermally oxidized. As a result, in the area of the region SPR1 where the isolation film EI is not formed, an insulating film for a gate insulating film is formed over the n⁻-type semiconductor region LDR1. Next, over the insulating film for a gate insulating film and over the isolation film EI, a conductive film made of, e.g., polycrystalline silicon (polysilicon) is formed and patterned. Thus, as shown in FIG. 20, over the n⁻-type semiconductor region LDR1 in the region SPR1, the gate electrode GE is formed via the gate insulating film GI1 and the field plate electrode FP1 is formed via the gate insulating film GI2. Note that, over the portion of the isolation film EI which is located over the resurf layer RSF1, the field plate electrode RFP made of, e.g., aluminum (Al) may also be formed. The field plate electrode RFP includes the plurality of partial electrodes RFP1.

Figure 21:
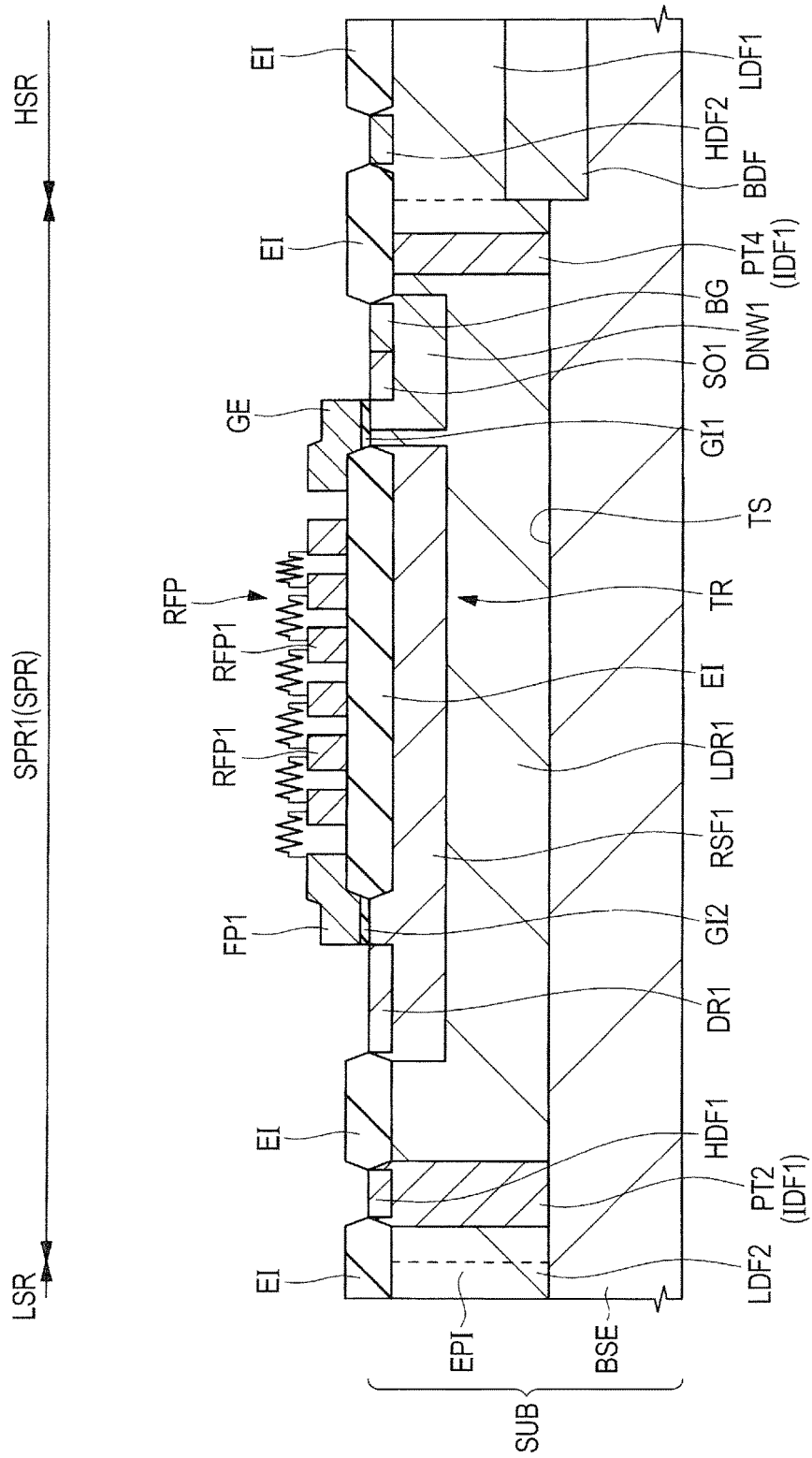
FIG. 21 is a main-portion cross-sectional view of the semiconductor device in Embodiment 1 during the manufacturing process thereof.

Next, as shown in FIG. 21, over the substrate SUB, a resist pattern (the illustration thereof is omitted) and, using the formed resist pattern as a mask, an n-type impurity is implanted into the substrate SUB by an ion implantation method and then the resist pattern is removed. Thus, in the region SPR1 of the isolation region SPR, the back gate BG as the n⁺-type semiconductor region is formed in the upper-layer portion of the n-type semiconductor region DNW1 while, in the higher-voltage circuit region HSR, the n⁺-type semiconductor region HDF2 is formed in the upper-layer portion of the n⁻-type semiconductor region LDF1.

Next, as shown in FIG. 21, over the substrate SUB, a resist pattern (the illustration thereof is omitted) is formed and, using the formed resist pattern as a mask, a p-type impurity is implanted into the substrate SUB by an ion implantation method and then the resist pattern is removed. Thus, in the region SPR1 of the isolation region SPR, the source region SO1 as the p⁺-type semiconductor region is formed in the upper-layer portion of the n-type semiconductor region DNW1, the drain region DR1 as the p⁺-type semiconductor region is formed in the upper-layer portion of the resurf layer RSF1, and the p⁺-type semiconductor region HDF1 is formed in the upper-layer portion of the p-type semiconductor region IDF1.

At this time, the gate insulating film GI1, the gate electrode GE, the resurf layer RSF1, the source region SO1, and the drain region DR1 form the coupling transistor TR.

Next, as shown in FIG. 4, in the region SPR1 of the isolation region SPR, the interlayer insulating film IL1 is formed over the substrate SUB so as to cover the source region SO1, the back gate BG, the gate electrode GE, the field plate electrodes RFP and FP1, the drain region DR1, and the p⁺-type semiconductor region HDF1. The interlayer insulating film IL1 is made of, e.g., silicon dioxide ($SiO_2$). At this time, in the higher-voltage circuit region HSR and the lower-voltage circuit region SLR, the interlayer insulating film IL1 is formed over the substrate SUB so as to cover the n⁺-type semiconductor region HDF2 and the p⁺-type semiconductor region HDF1.

Next, as shown in FIG. 4, in the region SPR1 of the isolation region SPR, the contacts SCNT1, SCNT2, GCNT1, FCNT1, FCNT2, DCNT1, and CNT1 are formed to extend through the interlayer insulating film IL1. At this time, in the higher-voltage circuit region HSR, the contact CNT2 is formed to extend through the interlayer insulating film IL1.

The contact SCNT1 is electrically coupled to the source region SO1, while the contact SCNT2 is electrically coupled to the back gate BG. The contact GCNT1 is electrically coupled to the gate electrode GE. The contact FCNT1 is electrically coupled to the field plate electrode FP1, while the contact FCNT2 is electrically coupled to the field plate electrode RFP. The contact DCNT1 is electrically coupled to the drain electrode DR1. The contact CNT1 is electrically coupled to the p⁺-type semiconductor region HDF1, while the contact CNT2 is electrically coupled to the n⁺-type semiconductor region HDF2.

Next, as shown in FIG. 4, in the region SPR1 of the isolation region SPR, the source electrode SOE1, the gate plate electrode GP1, the field plate electrode FE, the drain electrode DRE1, and the electrode SUE1 are formed. Each of the source electrode SOE1, the gate plate electrode GP1, the field plate electrode FE, the drain electrode DRE1, and the electrode SUE1 is made of, e.g., aluminum (Al). At this time, in the higher-voltage circuit region HSR, the electrode EL1 is formed. Note that, between any adjacent two of the source electrode SOE1, the gate plate electrode GP1, the field plate electrode FE, the drain electrode DRE1, and the electrode SUE1, the interlayer insulating film IL2 is formed.

The source electrode SOE1 is electrically coupled to the contacts SCNT1 and SCNT2. The gate plate electrode GP1 is electrically coupled to the contact GCNT1. The field plate electrode FE is electrically coupled to the contact FCNT2. The drain electrode DRE1 is electrically coupled to the contacts FCNT1 and DCNT1. The electrode SUE1 is electrically coupled to the contact CNT1. The electrode EL1 is electrically coupled to the contact CNT2.

Note that, by performing the process steps described using FIGS. 17 to 21, in the region SPR2 (see FIG. 5) of the isolation region SPR, the rectifying element HRD (see FIG. 5) is formed, though the illustration thereof is omitted. Also, by performing the process steps described using FIGS. 17 to 21, in the higher-voltage circuit region HSR, semiconductor elements included in the HIGH-side drive circuit HDC (see FIG. 2), such as, e.g., a transistor, are formed while, in the lower-voltage circuit region LSR, semiconductor elements included in the signal processing circuit LGC and the LOW-side drive circuit LDC (see FIG. 2), such as, e.g., a transistor, are formed. Thus, the semiconductor device SD in Embodiment 1 described using FIGS. 2 to 5 is formed.

Embodiment 2

In Embodiment 1, the description has been given of the example in which the coupling transistor TR is surrounded by the p-type semiconductor region IDF1. On the other hand, in Embodiment 2, a description will be given of an example in which the coupling transistor TR is surrounded by a DTI (Deep Trench Isolation) structure.

The semiconductor device in Embodiment 2 can be the same as the semiconductor device in Embodiment 1 except that the coupling transistor TR is surrounded by the DTI structure. Accordingly, a description of the semiconductor device in Embodiment 2 is omitted.

<Semiconductor Device in Embodiment 2>

Figure 22:
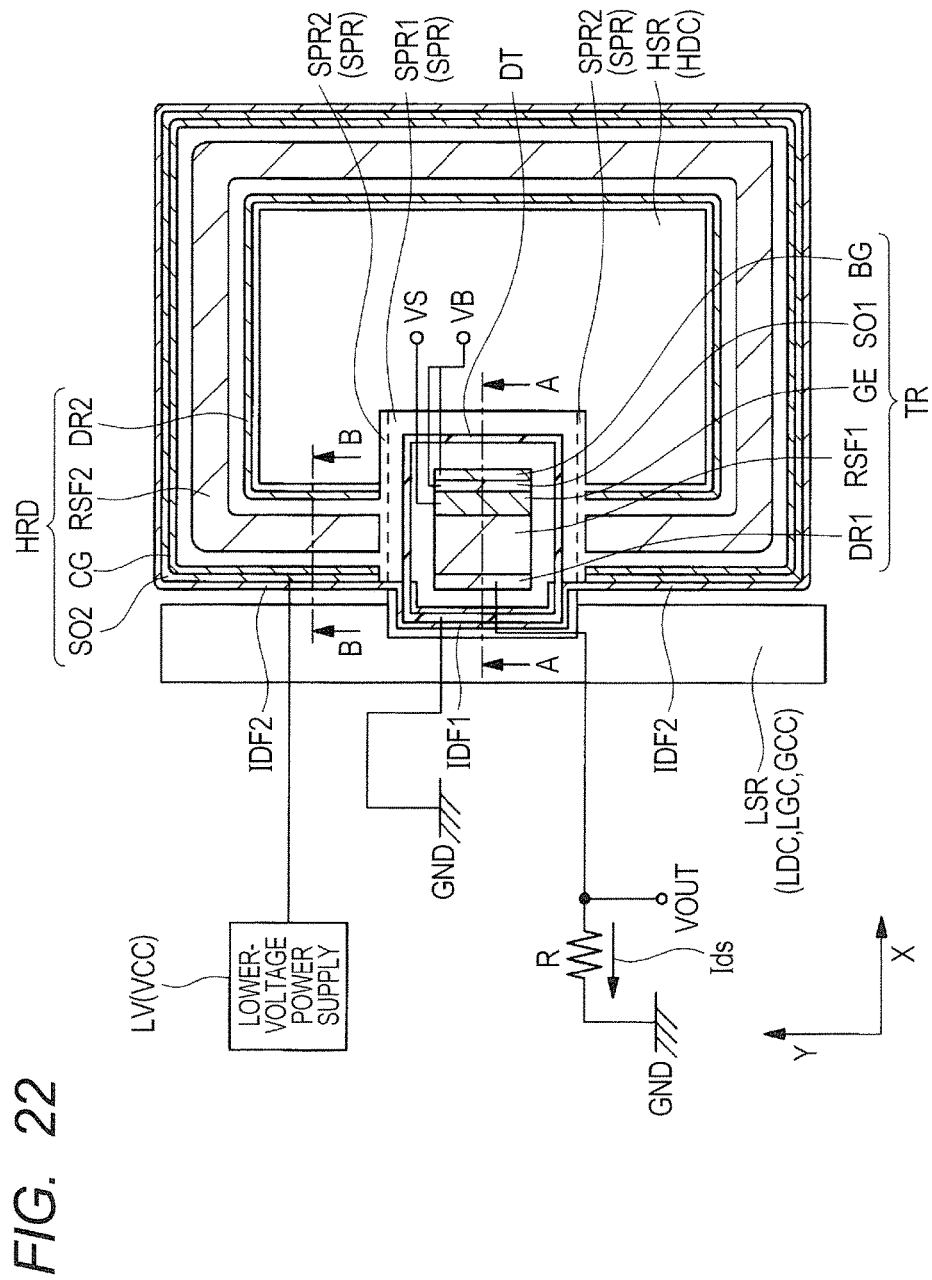
FIG. 22 is a main-portion plan view of a semiconductor device in Embodiment 2.
Figure 23:
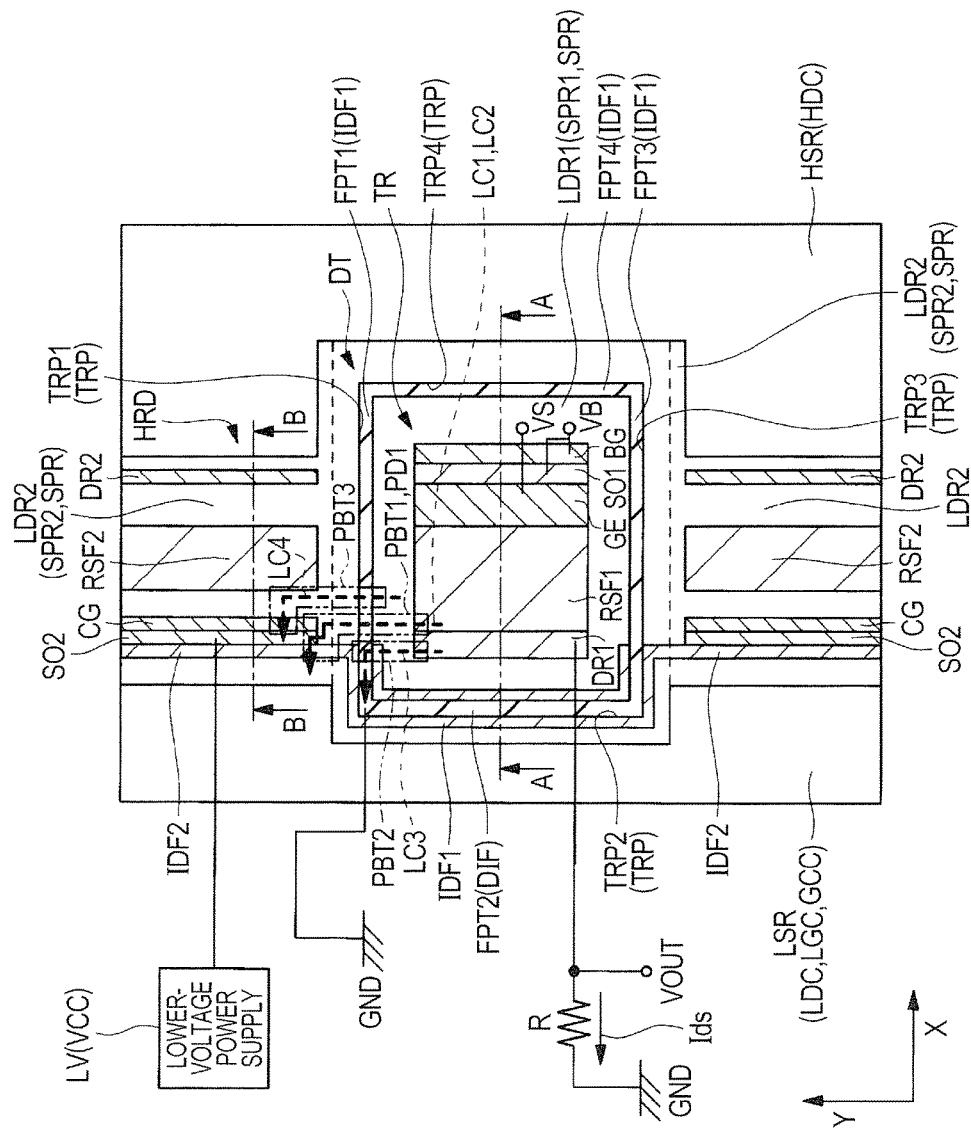
FIG. 23 is a main-portion plan view of the semiconductor device in Embodiment 2.
Figure 24:
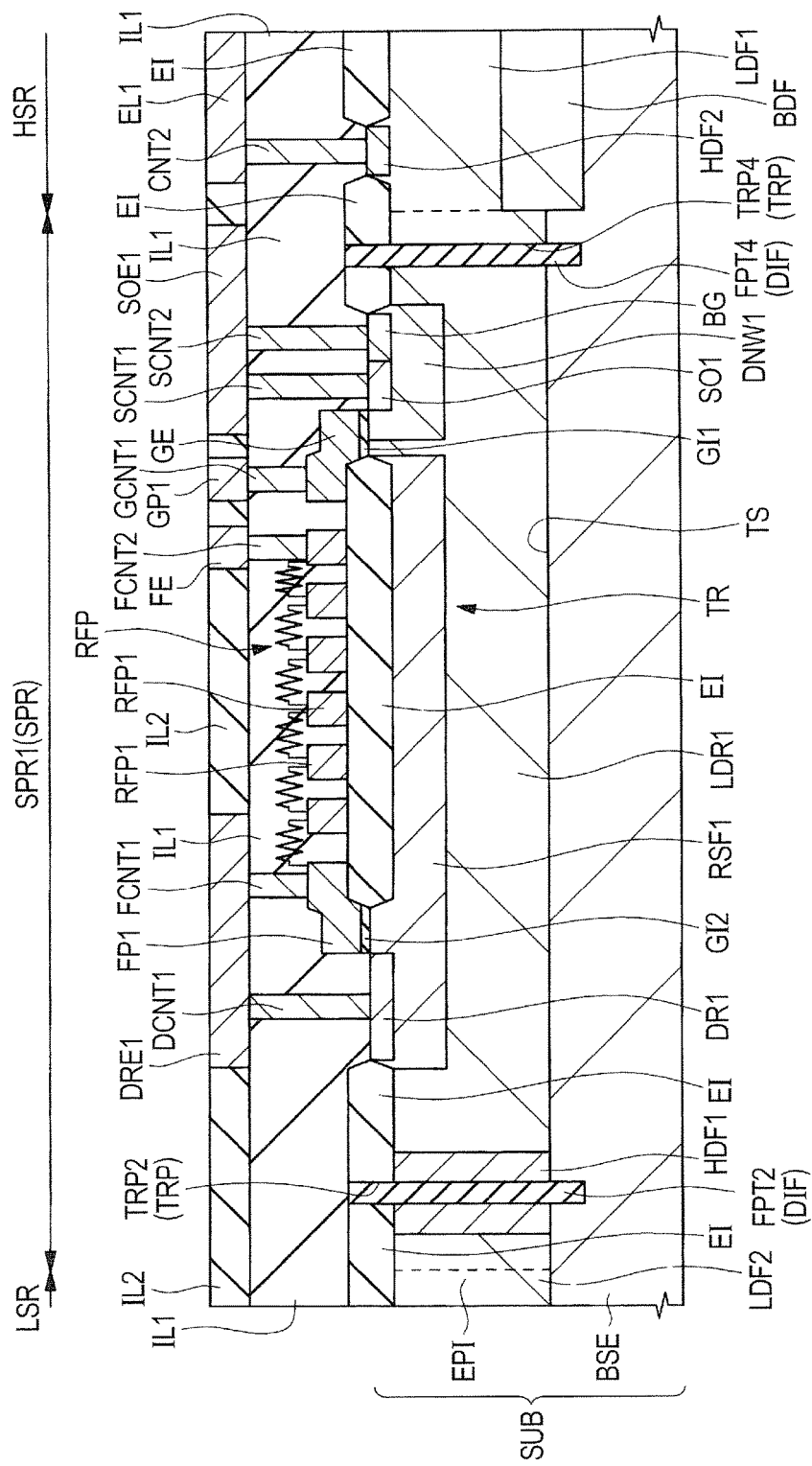
FIG. 24 is a main-portion cross-sectional view of the semiconductor device in Embodiment 2.

Next, a description will be given of the semiconductor device in Embodiment 2. FIGS. 22 and 23 are main-portion plan views of the semiconductor device in Embodiment 2. FIG. 24 is a main-portion cross-sectional view of the semiconductor device in Embodiment 2.

FIG. 22 shows the periphery of the coupling transistor TR. FIG. 23 shows the periphery of the coupling transistor TR in FIG. 22 in enlarged relation. In FIGS. 22 and 23, the state of electric coupling of the coupling transistor TR is schematically shown in conjunction with the plan view. FIG. 24 is a cross-sectional view along the line A-A in each of FIGS. 22 and 23. Note that the cross-sectional view along the line B-B in each of FIGS. 22 and 23 is the same as the cross-sectional view shown in FIG. 5.

In the semiconductor device in Embodiment 2 also, in the same manner as in the semiconductor device in Embodiment 1, the $n^-$-type semiconductor region LDR1 includes the portion of the $n^-$-type semiconductor layer EPI which is located in the region SPR1 of the isolation region SPR where the coupling transistor TR is formed. The area of the isolation region SPR other than the region SPR1 is the region SPR2.

In the semiconductor device in Embodiment 2, unlike in the semiconductor device in Embodiment 1, the source region SO1, the resurf layer RSF1, and the drain region DR1 are surrounded by a DTI structure DT as a replacement for the p-type semiconductor region IDF1. That is, the coupling transistor TR is surrounded by the DTI structure DT.

As shown in FIGS. 23 and 24, the DTI structure DT includes a trench portion TRP as an opening formed to extend from the upper surface of the $n^-$-type semiconductor layer EPI to at least a depth position midway in the $n^-$-type semiconductor layer EPI and an insulating film DIF embedded in the trench portion TRP. The trench portion TRP as the opening is formed in the portion of the $n^-$-type semiconductor region LDR1 which surrounds the source region SO1, the resurf layer RSF1, and the drain region DR1 in plan view to be apart from each of the source region SO1, the resurf layer RSF1, and the drain region DR1. The region SPR1 of the isolation region SPR includes the region surrounded by the insulating film DIF and the region where the insulating film DIF is formed.

In the example shown in FIG. 24, the insulating film DIF is not integrally formed with the interlayer insulating film IL1. However, the insulating film DIF may also be formed integrally with the interlayer insulating film IL1. The portion (film portion FPT2 described later) of the insulating film DIF which is located closer to the lower-voltage circuit region LSR than the coupling transistor TR is included in the p-type semiconductor region IDF1 in plan view.

The operation of the semiconductor device in Embodiment 2 can be the same as the operation of the semiconductor device in Embodiment 1.

In the semiconductor device in Embodiment 2, unlike in the semiconductor device in the comparative example, the $n^-$-type semiconductor region LDR1 as the portion of the base of the parasitic bipolar transistor PBT1 which is located in the region SPR1 is isolated from the $n^-$-type semiconductor region LDR2 and the source region SO2 each as the portion of the base of the parasitic bipolar transistor PBT1 which is located in the region SPR2 by the insulating film DIF. Accordingly, in the semiconductor device in Embodiment 2, in the same manner as in the semiconductor device in Embodiment 1, even when the power supply potential VCC lower than potentials in the drain region DR1 and the resurf layer RSF1 when the coupling transistor TR is in the ON state is supplied to the source region SO2 of the rectifying element HRD, the parasitic bipolar transistor PBT1 is less likely to be operated.

Also, in the semiconductor device in Embodiment 2, unlike in the semiconductor device in the comparative example, the $n^-$-type semiconductor region LDR1 as the portion of the parasitic diode PD1 which is located in the region SPR1 is isolated from the $n^-$-type semiconductor region LDR2 and the source region SO2 each as the portion of the parasitic diode PD1 which is located in the region SPR2 by the insulating film DIF. Consequently, in the semiconductor device in Embodiment 1, in the same manner as in the semiconductor device in Embodiment 1, even when the power supply potential VCC lower than the potentials in the drain region DR1 and the resurf layer RSF1 when the coupling transistor TR is in the ON state is supplied to the source region SO2 of the rectifying element HRD, the parasitic diode PD1 is less likely to be operated.

Therefore, in the semiconductor device in Embodiment 2, in the same manner as in the semiconductor device in Embodiment 1, it is possible to prevent or inhibit the leakage current LC1 or LC2 from flowing through the parasitic bipolar transistor PBT1 or the parasitic diode PD1 formed extensively from the region SPR1 to the region SPR2. This allows the coupling transistor TR as a level-down shifter made of the p-channel MOSFET and a semiconductor element such as, e.g., the rectifying element HRD to be mounted in proximate and mixed relation.

That is, according to Embodiment 2, even when the coupling transistor TR as the level-down shifter made of the p-channel MOSFET and the semiconductor element such as, e.g., the rectifying element HRD are mounted in proximate and mixed relation, the performance of the semiconductor device can be improved.

Preferably, the insulating film DIF includes a film portion FPT1 located on one side in the Y-axis direction in plan view (on the upper side in FIG. 23), a film portion FPT2 located on the side opposite to one side in the X-axis direction in plan view (on the left side in FIG. 23), and a film portion FPT3 located on the side opposite to the one side in the Y-axis direction in plan view (on the lower side in FIG. 23). Of the insulating film DIF, the film portions FPT1, FPT2, and FP3 are integrally formed.

At this time, the trench portion TRP as the opening includes a portion TRP1 located on one side of the resurf layer RSF1 and the drain region DR1 in the Y-axis direction in plan view (on the upper side in FIG. 23). The trench portion TRP as the opening also includes a portion TRP2 located on the side of the resurf layer RSF1 and the drain region DR1 which is opposite to the one side thereof in the X-axis direction in plan view. The trench portion TPR as the opening also includes a portion TRP3 located on the side opposite to the one side in the Y-axis direction in plan view (on the lower side in FIG. 23). Of the trench portion TRP, the portions TRP1, TRP2, and TRP3 are integrally formed. The film portion FPT1 is embedded in the portion TRP1. The film portion FPT2 is embedded in the portion TRP2. The film portion FPT3 is embedded in the portion TRP3.

In such a case also, it is possible to reliably prevent or inhibit the leakage current LC1 or LC2 from flowing through the parasitic bipolar transistor PBT1 or the parasitic diode PD1 formed extensively from the region SPR1 to the region SPR2 when, e.g., the potential in the n⁻-type semiconductor region LDR1 is equal to the potential in the n⁻-type semiconductor region LDF1.

More preferably, the insulating film DIF includes a film portion FPT4 located on the one side in the X-axis direction in plan view (on the right side in FIG. 23). Of the insulating film DIF, the film portions FPT1, FPT2, FPT3, and FPT4 are integrally formed. At this time, the trench portion TRP includes a portion TRP4 located on the one side in the X-axis direction in plan view (on the right side in FIG. 23). Of the trench portion TRP, the portions TRP1, TRP2, TRP3, and TRP4 are integrally formed. The film portion FPT4 is embedded in the portion TRP4.

In such a case, it is possible to more reliably prevent or inhibit the leakage current LC1 or LC2 from flowing through the parasitic bipolar transistor PBT1 or the parasitic diode PD1 formed extensively from the region SPR1 to the region SPR2.

Note that, at this time, each of the source region SO2, the control gate electrode CG, the resurf layer RSF2, and the drain region DR2 of the rectifying element HRD is formed in, e.g., the portion of the n⁻-type semiconductor region LDR2 which is located on the one side of the film portion FPT1 in the Y-axis direction (on the upper side in FIG. 23) to be apart from the film portion FPT1. An n-type impurity in the source region SO2 is higher than an n-type impurity in the n⁻-type semiconductor region LDR2. On the other hand, in the region SPR2, the p-type semiconductor region IDF2 is formed in, e.g., the portion of the n⁻-type semiconductor region LDR2 which is located on the one side of the film portion FPT1 in the Y-axis direction (on the upper side in FIG. 23) to be in contact with the base BSE.

Preferably, the trench portion TRP extends from the upper surface of the isolation film EI through the n⁻-type semiconductor region LDR1 and reaches the base BSE. At this time, the insulating film DIF formed in the trench portion TRP is in contact with the base BSE. In such a case also, it is possible to reliably prevent or inhibit the leakage current LC1 or LC2 from flowing through the parasitic bipolar transistor PBT1 or the parasitic diode PD1 formed extensively from the region SPR1 to the region SPR2.

In a most preferable case, the entire insulating film DIF is integrally formed and the integrally formed insulating film DIF surrounds the entire periphery of the coupling transistor TR and has the entire periphery thereof in contact with the base BSE. In such a case, it is possible to completely prevent the leakage current LC1 or LC2 from flowing through the parasitic bipolar transistor PBT1 or the parasitic diode PD1 formed extensively from the region SPR1 to the region SPR2.

The widths of the trench portion TRP and the insulating film DIF in directions orthogonal to the extending directions thereof in the semiconductor device in Embodiment 2 can be set smaller than the width of the p-type semiconductor region IDF1 in a direction orthogonal to the extending direction thereof in the semiconductor device in Embodiment 1. Accordingly, the semiconductor device in Embodiment 2 can more easily be reduced in size than the semiconductor device in Embodiment 1.

Specifically, the widths of the trench portion TRP and the insulating film DIF in the semiconductor device in Embodiment 2 can be set to about 1 to 2 μm on the basis of the processing accuracy of photolithography and etching. On the other hand, the width of the p-type semiconductor region IDF1 in the semiconductor device in Embodiment 1 can be set to about 5 to 10 μm on the basis of dimensional accuracy in impurity diffusion.

In the semiconductor device in Embodiment 1, depending on the potentials supplied individually to the n⁻-type semiconductor regions LDR1 and LDR2 and the p-type semiconductor region IDF1, a leakage current may possibly flow between the n⁻-type semiconductor regions LDR1 and LDR2 via pn junctions between the n⁻-type semiconductor regions LDR1 and LDR2 and the p-type semiconductor region IDF1.

On the other hand, in the semiconductor device in Embodiment 2, irrespective of the potentials supplied individually to the n⁻-type semiconductor regions LDR1 and LDR2 and the p-type semiconductor region IDF1, it is possible to prevent or inhibit a leakage current to flow between the n⁻-type semiconductor regions LDR1 and LDR2. By increasing the width of the trench portion TRP, it is possible to improve the dielectric strength of the isolation region SPR which provides isolation between the higher-voltage circuit region HSR and the lower-voltage circuit region LSR.

Note that the stress applied by the p-type semiconductor region IDF1 formed by introducing an impurity to the n⁻-type semiconductor regions LDR1 and LDR2 in Embodiment 1 can easily be set smaller than the stress applied by the insulating film DIF embedded in the trench portion TRP to the n⁻-type semiconductor regions LDR1 and LDR2 in Embodiment 2.

Accordingly, in the semiconductor device in Embodiment 1, it is possible to improve the characteristics of the coupling transistor TR, the rectifying element HRD, and the like, while more reliably preventing or inhibiting the leakage current LC1 or LC2 from flowing through the parasitic bipolar transistor PBT1 or the parasitic diode PD1 than in the semiconductor device in Embodiment 2.

Note that, in Embodiment 2 also, in the same manner as in Embodiment 1, it is possible to prevent or inhibit the leakage current LC3 from flowing through the parasitic bipolar transistor PBT2 and prevent or inhibit the leakage current LC4 from flowing through the parasitic bipolar transistor PBT3.

<Method of Manufacturing Semiconductor Device in Embodiment 2>

Figure 25:
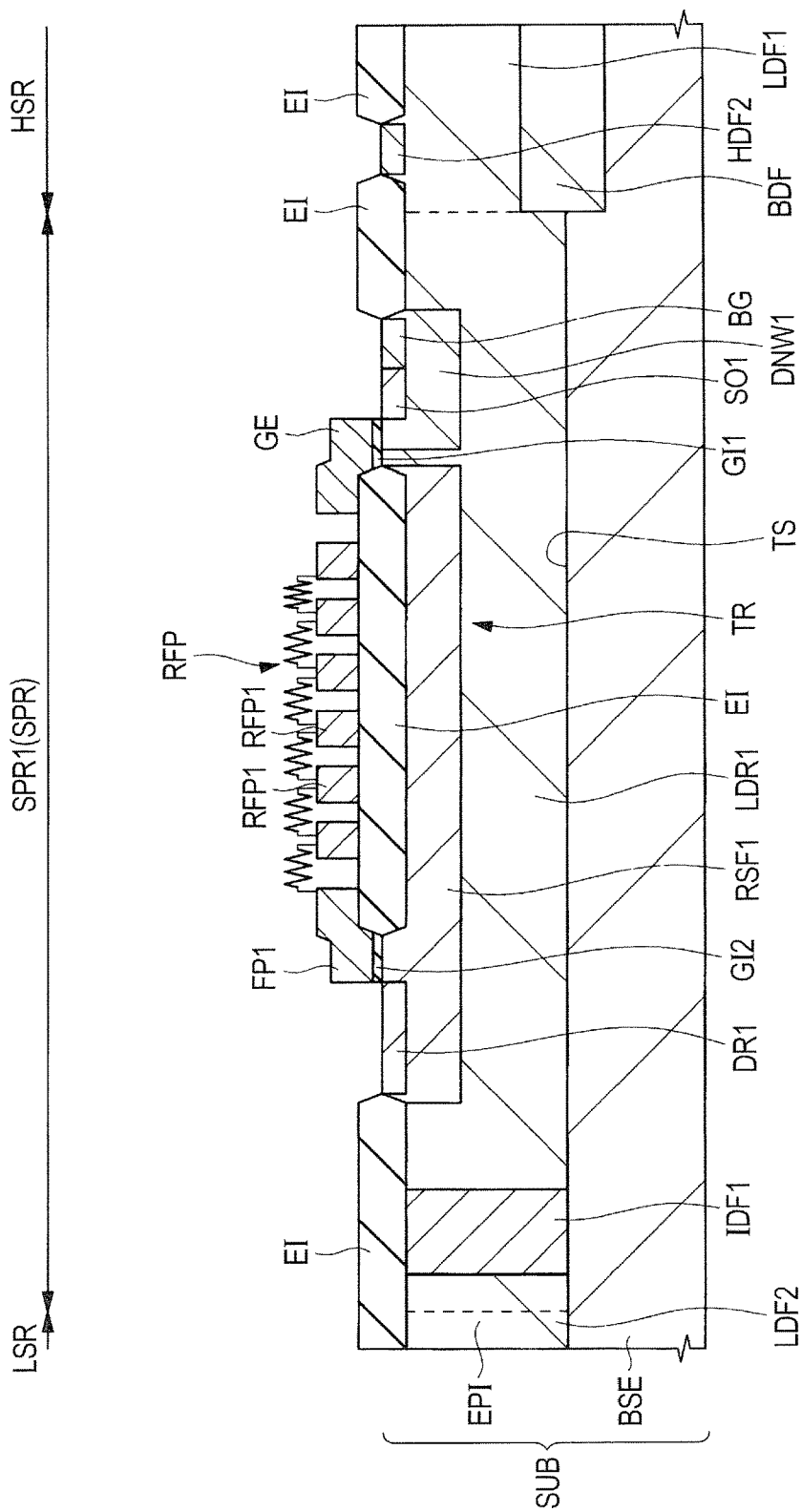
FIG. 25 is a main-portion cross-sectional view of the semiconductor device in Embodiment 2 during a manufacturing process thereof.
Figure 26:
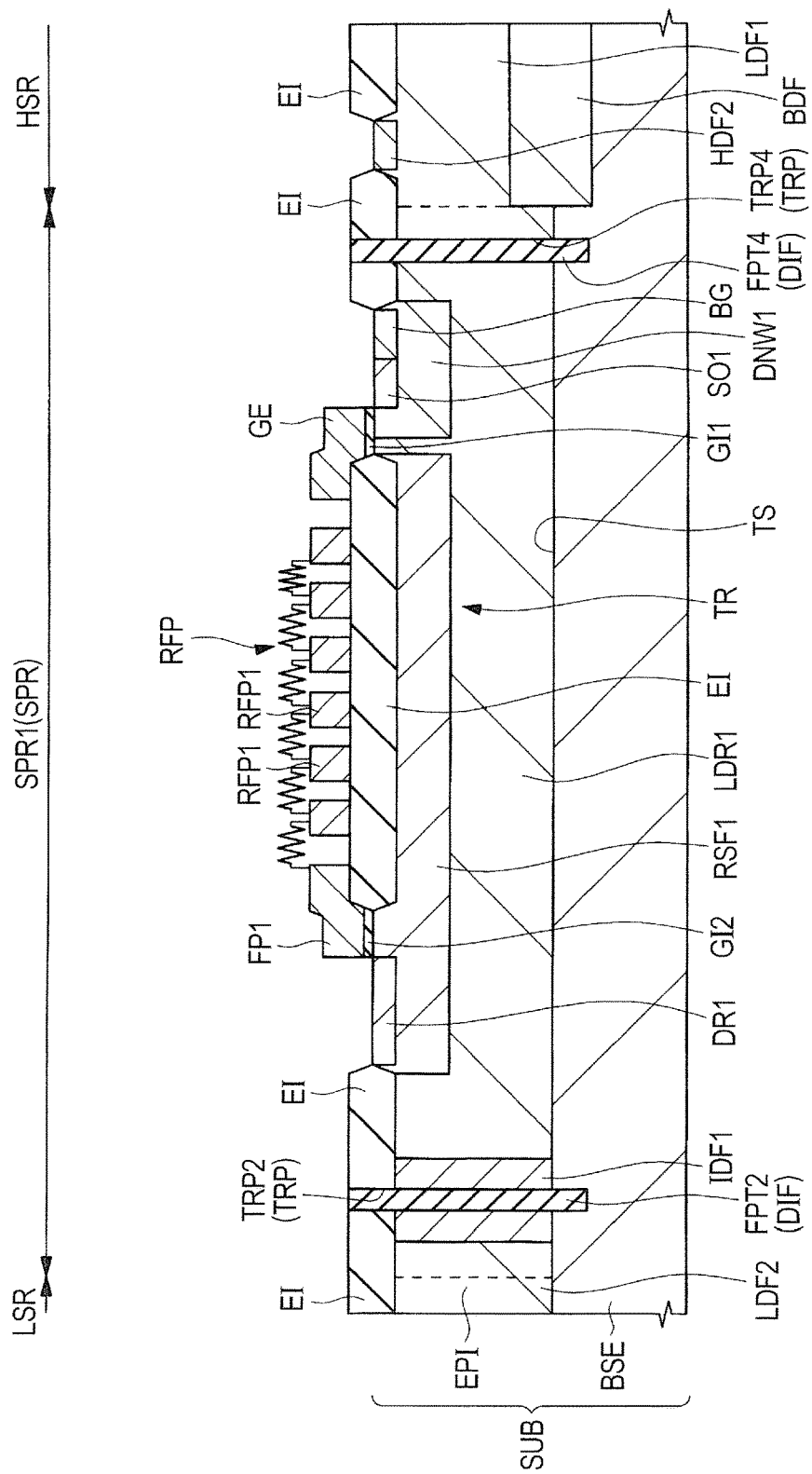
FIG. 26 is a main-portion cross-sectional view of the semiconductor device in Embodiment 2 during the manufacturing process thereof.

Next, a description will be given of a method of manufacturing the semiconductor device in Embodiment 2. FIGS. 25 and 26 are main-portion cross-sectional views of the semiconductor device in Embodiment 2 during the manufacturing process thereof.

In the manufacturing process of the semiconductor device in Embodiment 2, the same process steps as those described using FIGS. 17 to 21 in Embodiment 1 are performed until the step of forming semiconductor regions such as the source region SO1, the drain region DR1, and the back gate BF is performed, as shown in FIG. 25.

Note that, in Embodiment 2, in the region SPR1 of the isolation region SPR, the p-type semiconductor region IDF1 is not formed so as to surround the coupling transistor TR. Accordingly, as shown in FIG. 25, in the region of the region SPR1 which is located opposite to the gate electrode GE relative to the source region SO1 interposed therebetween, the p-type semiconductor region IDF1 is not formed.

Next, as shown in FIG. 26, the trench portion TRP is formed. In the steps of forming the trench portion TRP, a resist pattern (the illustration thereof is omitted) is formed over the substrate SUB and, using the formed resist pattern as a mask, the substrate SUB is etched to form the trench portion TRP extending from the upper surface of the isolation film EI through the n⁻-type semiconductor region LDR1 and reaching the base BSE. At this time, in the region of the region SPR1 which is located opposite to the gate electrode GE relative to the drain region DR1 interposed therebetween, the portion TRP2 of the trench portion TRP may also be formed so as to extend from the upper surface of the isolation film EI through the p-type semiconductor region IDF1 and reach the base BSE, unlike the portion TRP4 of the trench portion TRP. Note that, after the trench portion TRP is formed, the resist pattern is removed.

Next, as shown in FIG. 26, the insulating film DIF is formed so as to be embedded in the trench portion TRP. Thus, in the portion TRP2 of the trench portion TRP, the film portion FPT2 of the insulating film DIF is embedded and, in the portion TRP4 of the trench portion TRP, the film portion FPT4 of the insulating film DIF is embedded. The insulating film DIF is made of, e.g., silicon dioxide ($SiO_2$). Note that the insulating film DIF may also be formed integrally with the interlayer insulating film IL1.

Then, the same step as the step described using FIG. 4 in Embodiment 1 is performed to form the semiconductor device SD in Embodiment 2 described using FIGS. 21 to 23.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
 a base made of a p-type semiconductor;
 an n-type semiconductor layer formed over a first region of a main surface of the base;
 a first gate insulating film formed over the n-type semiconductor layer;
 a first gate electrode formed over the first gate insulating film;
 a p-type first semiconductor region formed in an upper-layer portion of a part of the n-type semiconductor layer which is located on a first side of the first gate electrode in a first direction in plan view;
 a p-type second semiconductor region formed in an upper-layer portion of a part of the n-type semiconductor layer which is located on a second side of the first gate electrode opposite to the first side of the first gate electrode in plan view, said p-type second semiconductor region having a first side facing said first gate electrode in said first direction;
 a p-type third semiconductor region formed in an upper-layer portion of a part of the p-type second semiconductor region which is located opposite to the first gate electrode in plan view;
 a p-type fourth semiconductor region formed in a part of the n-type semiconductor layer which surrounds the p-type first semiconductor region, the p-type second semiconductor region and the p-type third semiconductor region in plan view, to be apart from the p-type first semiconductor region, the p-type second semiconductor region and the p-type third semiconductor region;
 a first circuit portion formed over a second region of the main surface of the base which is located on a first side of the first region of the main surface of the base in plan view; and
 a second circuit portion formed over a third region of the main surface of the base which is located on a second side of the first region of the main surface of the base opposite to the first side of the first region of the main surface of the base in plan view,
 wherein a p-type impurity concentration in the p-type third semiconductor region is higher than a p-type impurity concentration in the p-type second semiconductor region,
 wherein a first power supply potential is supplied to the first circuit portion,
 wherein a second power supply potential is supplied to the second circuit portion,
 wherein the first power supply potential is higher than the second power supply potential,
 wherein the first gate electrode is electrically coupled to the first circuit portion,
 wherein the p-type third semiconductor region is electrically coupled to the second circuit portion,
 wherein the first gate insulating film, the first gate electrode, the p-type first semiconductor region, the p-type second semiconductor region, and the p-type third semiconductor region form a first transistor which couples the first circuit portion and the second circuit portion to each other,
 wherein the p-type fourth semiconductor region includes an extension portion located on a side of the p-type second semiconductor region and the p-type third semiconductor region in a direction intersecting the first direction in plan view,
 wherein the semiconductor device further comprises an n-type fifth semiconductor region formed in an upper-layer portion of a part of the n-type semiconductor layer which is located on the side of the p-type second semiconductor region with the extension portion of the p-type fourth semiconductor region to be apart from the extension portion of the p-type fourth semiconductor region,
 wherein an n-type impurity concentration in the n-type fifth semiconductor region is higher than an n-type impurity concentration in the n-type semiconductor layer,
 wherein the part of the n-type semiconductor layer which is located on the side of the p-type second semiconductor region with the extension portion of the p-type fourth semiconductor region is continuous with a portion of the n-type semiconductor layer which is located in the second region of the main surface of the base,
 wherein the semiconductor device further comprises
 a second gate insulating film formed over a part of the n-type semiconductor layer which is located on the side of the p-type second semiconductor region with the extension port ion to be apart from the extension portion;
 a second gate electrode formed over the second gate insulating film; and
 an n-type sixth semiconductor region formed in an upper-layer portion of a part of the n-type semiconductor layer which is located on the third side with the extension portion to be apart from the extension portion, wherein the n-type fifth semiconductor region is located on a side of the second gate electrode opposite to a first side of the second gate electrode in plan view, wherein the n-type sixth semiconductor region is located on the first side of the second gate electrode in plan view, wherein an n-type impurity concentration in the n-type sixth semiconductor region is higher than the n-type impurity concentration in the n-type semiconductor layer, and wherein the second gate insulating film, the second gate electrode, the n-type fifth semiconductor region, and the n-type sixth semiconductor region form a second transistor.

2. The semiconductor device according to claim 1, wherein the p-type fourth semiconductor region includes:
a first portion located on a second side of the p-type second semiconductor region in a second direction intersecting the first direction in plan view;
a second portion located on a side of the p-type third semiconductor region opposite to the first side of the p-type second semiconductor region in plan view; and
a third portion located on a side of the p-type second semiconductor region opposite to the second side of the p-type second semiconductor region in the second direction in plan view, and
wherein the first, second, and third portions of the p-type fourth semiconductor region are integrally formed.

3. The semiconductor device according to claim 2, wherein the p-type fourth semiconductor region includes:
a fourth portion located on a first side of the p-type first semiconductor region in the first direction in plan view, and
wherein the first, second, third, and fourth portions of the p-type fourth semiconductor region are integrally formed.

4. The semiconductor device according to claim 1, wherein the p-type fourth semiconductor region is in contact with the base.

5. The semiconductor device according to claim 1, wherein, to the n-type fifth semiconductor region, a potential lower than a potential in the p-type third semiconductor region when the first transistor is in an ON state is supplied.

6. The semiconductor device according to claim 1, further comprising:
a p-type seventh semiconductor region formed in a part of the n-type semiconductor layer which is located on the third side with the extension portion in the first region,
wherein the p-type seventh semiconductor region is in contact with the base.

7. The semiconductor device according to claim 6, wherein, to the n-type fifth semiconductor region, a potential lower than a potential in the p-type third semiconductor region when the first transistor is in an ON state is supplied, and
wherein a potential in the base is a ground potential.

8. The semiconductor device according to claim 1, wherein a length of the p-type second semiconductor region in the first direction is larger than a length of the p-type first semiconductor region in the first direction.

9. The semiconductor device according to claim 1, further comprising:
an n-type seventh semiconductor region formed in an upper-layer portion of a part of the n-type semiconductor layer which is located opposite to the first gate electrode relative to the p-type first semiconductor region interposed therebetween in plan view; and
a first wiring line formed over the p-type first semiconductor region and over the n-type seventh semiconductor region,
wherein an n-type impurity concentration in the n-type seventh semiconductor region is higher than the n-type impurity concentration in the n-type semiconductor layer, and
wherein the n-type seventh semiconductor region is electrically coupled to the p-type first semiconductor region via the first wiring line.

10. A semiconductor device, comprising:
a base made of a p-type semiconductor;
an n-type semiconductor layer formed over a first region of a main surface of the base;
a first gate insulating film formed over the n-type semiconductor layer;
a first gate electrode formed over the first gate insulating film;
a p-type first semiconductor region formed in an upper-layer portion of a part of the n-type semiconductor layer which is located on a first side of the first gate electrode in a first direction in plan view;
a p-type second semiconductor region formed in an upper-layer portion of a part of the n-type semiconductor layer which is located on a second side of the first gate electrode opposite to the first side of the first gate electrode in plan view, said p-type second semiconductor region having a first side facing said first gate electrode in said first direction;
a p-type third semiconductor region formed in an upper-layer portion of a part of the p-type second semiconductor region which is located opposite to the first gate electrode in plan view;
a p-type fourth semiconductor region formed in a part of the n-type semiconductor layer which surrounds the p-type first semiconductor region, the p-type second semiconductor region and the p-type third semiconductor region in plan view, to be apart from the p-type first semiconductor region, the p-type second semiconductor region and the p-type third semiconductor region;
a first circuit portion formed over a second region of the main surface of the base which is located on a first side of the first region of the main surface of the base in plan view; and
a second circuit portion formed over a third region of the main surface of the base which is located on a second side of the first region of the main surface of the base opposite to the first side of the first region of the main surface of the base in plan view,
wherein a p-type impurity concentration in the p-type third semiconductor region is higher than a p-type impurity concentration in the p-type second semiconductor region,
wherein a first power supply potential is supplied to the first circuit portion,
wherein a second power supply potential is supplied to the second circuit portion,
wherein the first power supply potential is higher than the second power supply potential,
wherein the first gate electrode is electrically coupled to the first circuit portion,
wherein the p-type third semiconductor region is electrically coupled to the second circuit portion,
wherein the first gate insulating film, the first gate electrode, the p-type first semiconductor region, the p-type second semiconductor region, and the p-type third semiconductor region form a first transistor which couples the first circuit portion and the second circuit portion to each other, wherein the p-type fourth semiconductor region includes an extension portion located on a side of the p-type second semiconductor region and the p-type third semiconductor region in a direction intersecting the first direction in plan view, wherein the semiconductor device further comprises an n-type fifth semiconductor region formed in an upper-layer portion of a part of the n-type semiconductor layer which is located on the side of the p-type second semiconductor region with the extension portion of the p-type fourth semiconductor region to be apart from the extension portion of the p-type fourth semiconductor region, wherein an n-type impurity concentration in the n-type fifth semiconductor region is higher than an n-type impurity concentration in the n-type semiconductor layer, wherein the semiconductor device further comprises a second gate insulating film formed over a part of the n-type semiconductor layer which is located on the side of the p-type second semiconductor region with the extension portion to be apart from the extension portion;

a second gate electrode formed over the second gate insulating film; and an n-type sixth semiconductor region formed in an upper-layer portion of a part of the n-type semiconductor layer which is located on the side of the p-type second semiconductor region side with the extension portion to be apart from the extension portion, wherein the n-type fifth semiconductor region is located on a side of the second gate electrode opposite to a first side of the second gate electrode in plan view, wherein the n-type sixth semiconductor region is located on the first side of the second gate electrode in plan view, wherein an n-type impurity concentration in the n-type sixth semiconductor region is higher than the n-type impurity concentration in the n-type semiconductor layer, and wherein the second gate insulating film, the second gate electrode, the n-type fifth semiconductor region, and the n-type sixth semiconductor region form a second transistor.

11. The semiconductor device according to claim 10, wherein the p-type fourth semiconductor region includes:

a first portion located on a second side of the p-type second semiconductor region in a second direction intersecting the first direction in plan view;

a second portion located on a side of the p-type third semiconductor region opposite to the first side of the p-type second semiconductor region in plan view; and a third portion located on a side of the p-type second semiconductor region opposite to the second side of the p-type second semiconductor region in the second direction in plan view, and wherein the first, second, and third portions of the p-type fourth semiconductor region are integrally formed.

12. The semiconductor device according to claim 11, wherein the p-type fourth semiconductor region includes:

a fourth portion located on a first side of the p-type first semiconductor region in the first direction in plan view, and wherein the first, second, third, and fourth portions of the p-type fourth semiconductor region are integrally formed.

13. The semiconductor device according to claim 10, wherein the p-type fourth semiconductor region is in contact with the base.

14. The semiconductor device according to claim 10, wherein, to the n-type fifth semiconductor region, a potential lower than a potential in the p-type third semiconductor region when the first transistor is in an ON state is supplied.

15. The semiconductor device according to claim 10, further comprising:

a p-type seventh semiconductor region formed in a part of the n-type semiconductor layer which is located on the third side with the extension portion in the first region, wherein the p-type seventh semiconductor region is in contact with the base.

16. The semiconductor device according to claim 15, wherein, to the n-type fifth semiconductor region, a potential lower than a potential in the p-type third semiconductor region when the first transistor is in an ON state is supplied, and wherein a potential in the base is a ground potential.

17. The semiconductor device according to claim 10, wherein a length of the p-type second semiconductor region in the first direction is larger than a length of the p-type first semiconductor region in the first direction.

18. The semiconductor device according to claim 10, further comprising:

an n-type seventh semiconductor region formed in an upper-layer portion of a part of the n-type semiconductor layer which is located opposite to the first gate electrode relative to the p-type first semiconductor region interposed therebetween in plan view; and a first wiring line formed over the p-type first semiconductor region and over the n-type seventh semiconductor region, wherein an n-type impurity concentration in the n-type seventh semiconductor region is higher than the n-type impurity concentration in the n-type semiconductor layer, and wherein the n-type seventh semiconductor region is electrically coupled to the p-type first semiconductor region via the first wiring line.

* * * * *